United States Patent
Quevedo Lopez et al.

(10) Patent No.: US 12,298,452 B2
(45) Date of Patent: May 13, 2025

(54) RADIATION DETECTORS HAVING PEROVSKITE FILMS

(71) Applicant: Board of Regents, The University of Texas System, Austin, TX (US)

(72) Inventors: Manuel Quevedo Lopez, Richardson, TX (US); Jesus Alfonso Caraveo Frescas, Richardson, TX (US); Martin Gregorio Reyes Banda, Richardson, TX (US); Leunam Fernandez Izquierdo, Dallas, TX (US); Iker Rodrigo Chavez-Urbiola, Dallas, TX (US); Xavier Mathew, Richardson, TX (US); Lidia C. El Bouanani, Denton, TX (US); Rouzbeh Molaei Imenabadi, Dallas, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 143 days.

(21) Appl. No.: 18/042,369

(22) PCT Filed: Aug. 25, 2021

(86) PCT No.: PCT/US2021/047532
§ 371 (c)(1),
(2) Date: Feb. 21, 2023

(87) PCT Pub. No.: WO2022/046891
PCT Pub. Date: Mar. 3, 2022

(65) Prior Publication Data
US 2023/0314636 A1 Oct. 5, 2023

Related U.S. Application Data

(60) Provisional application No. 63/070,617, filed on Aug. 26, 2020.

(51) Int. Cl.
*G01T 1/24* (2006.01)
*G01T 3/08* (2006.01)
(Continued)

(52) U.S. Cl.
CPC .................. *G01T 1/24* (2013.01); *G01T 3/08* (2013.01); *H10F 30/301* (2025.01); *H10F 77/16* (2025.01)

(58) Field of Classification Search
CPC ........... G01T 1/24; G01T 3/08; H01L 31/036
See application file for complete search history.

(56) References Cited

U.S. PATENT DOCUMENTS

| 5,128,316 A * | 7/1992 | Agostinelli ........... C23C 14/087 505/703 |
| 2021/0062364 A1* | 3/2021 | Joglekar ................... C30B 7/14 |

(Continued)

FOREIGN PATENT DOCUMENTS

| CN | 107369763 | 11/2017 |
| CN | 110993503 | 4/2020 |

(Continued)

OTHER PUBLICATIONS

International Search Report and Written Opinion, International Application No. PCT/US2021/047532, mail date Nov. 26, 2021, 15 pages.

(Continued)

*Primary Examiner* — Hugh Maupin
(74) *Attorney, Agent, or Firm* — SALIWANCHIK, LLOYD & EISENSCHENK

(57) ABSTRACT

Solid-state radiation detectors utilizing a film as an alpha detection layer are provided. The detector can include a neutron conversion layer disposed thereon to enable neutron detection. The film can detect alpha particles from the ambient environment or emitted by the neutron conversion (Continued)

layer (if present) so the device can detect alpha particles and/or neutrons. The film can generate electron-hole pairs and can be disposed near a semiconductor material. The film can have a thickness of, for example, at least 100 nanometers.

17 Claims, 17 Drawing Sheets

(51) Int. Cl.
*H10F 30/00* (2025.01)
*H10F 77/16* (2025.01)

(56) References Cited

U.S. PATENT DOCUMENTS

| | | | |
|---|---|---|---|
| 2022/0221600 A1* | 7/2022 | Kreouzis | G01T 1/24 |
| 2022/0344525 A1* | 10/2022 | Datta | H01L 31/022408 |
| 2023/0141202 A1* | 5/2023 | Negami | G01T 1/24 250/370.14 |
| 2023/0349827 A1* | 11/2023 | Simpson | G01T 1/178 |

FOREIGN PATENT DOCUMENTS

| | | |
|---|---|---|
| CN | 110993707 | 4/2020 |
| WO | 2019/195194 | 10/2019 |

OTHER PUBLICATIONS

Higgins et al., Solvent-free and large area compatible deposition of methylammonium lead bromide perovskite by close space sublimation and its application in PIN diodes, Thin Solid Films 692, 2019, 8 pages.

Lidia El Bouanani et al., Solid-State Neutron Detection Based on Methylammonium Lead Bromide Perovskite Single Crystals, American Chemical Society, ACS Appl. Mater. Interfaces 2021, 13, pp. 28049-28056.

Martin Gregorio Reyes-Banda et al.,Material Properties Modulation in Inorganic Perovskite Films via Solution-Free Solid-State Reactions, American Chemical Society, ACS Appl. Electron. Mater. 2021, 3, pp. 468-1476.

Fernandez-Izquierdo et al., Cesium Lead Bromide (CsPbBr3) Thin-Film-Based Solid-State Neutron Detector Developed by a Solution-Free Sublimation Process, Advanced Materials Technologies, 2020, 5, 7 pages.

Yuhai Zhang et al., Metal Halide Perovskite Nanosheet for X ray High-Resolution Scintillation Imaging Screens, America Chemical Society, ACS Nano 2019, 13, pp. 2520-2525.

Jianxu Ding et al., High Detectivity and Rapid Response in Perovskite CsPbBr3 Single-Crystal Photodetector, The Journal of Physical Chemistry, 2017, 121, pp. 4917-4923.

Makhsud I. Saidaminov et al., Inorganic Lead Halide Perovskite Single Crystals: Phase-Selective Low-Temperature Growth, Carrier Transport Properties, and Self-Powered Photodetection, Advanced Optical Materials, 2017, 5, 1600704, 7 pages.

Yihui He et al., Perovskite CsPbBr3 single crystal detector for alpha-particle spectroscopy, Nuclear Inst. and Methods in Physics Research, A 922 (2019), pp. 217-221.

John W. Murphy et at., Optimizing diode thickness for thin-film solid state thermal neutron detectors, Research Article, Applied Physics Letters 101, 143506 (2012), 6 pages.

Yihui He et al., High spectral resolution of gamma-rays at room temperature by perovskite CsPbBr3 single crystals, Nature Communication, (2018), 9:1609, 8 pages.

\* cited by examiner

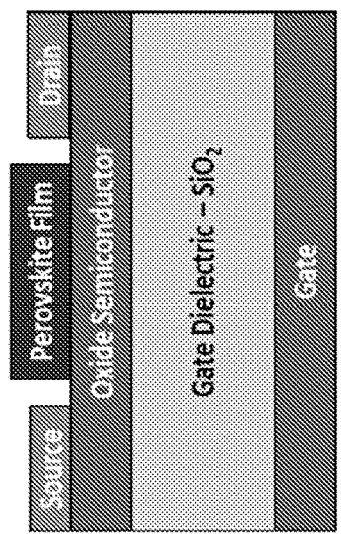
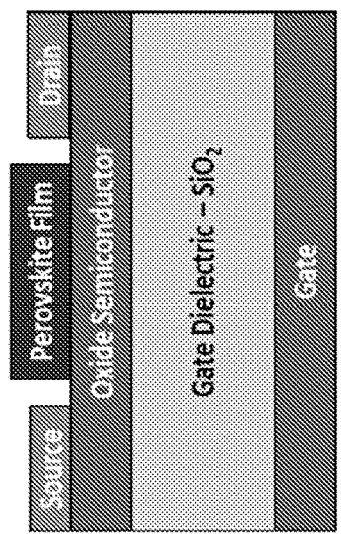
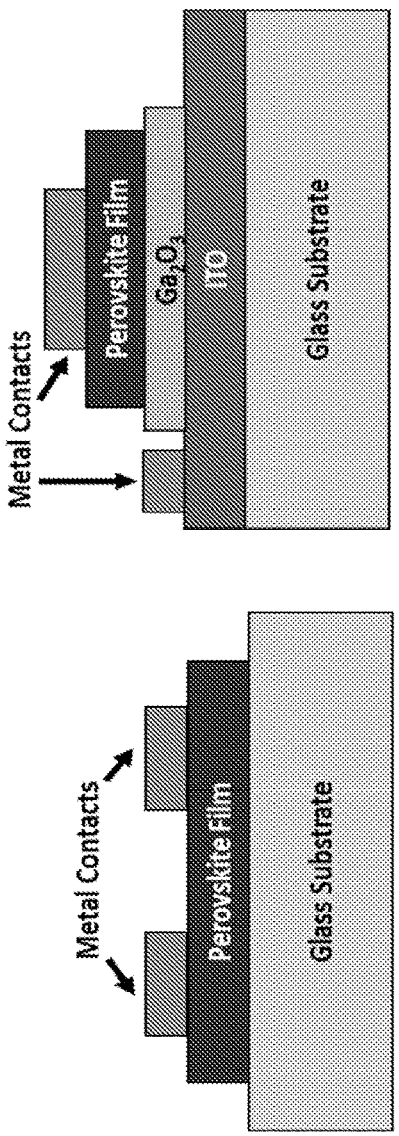
FIG. 1(a)    FIG. 1(b)    FIG. 1(c)
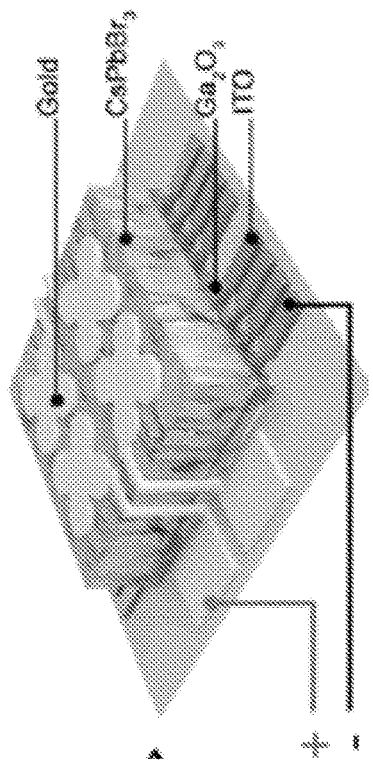
FIG. 2

RADIATION DETECTORS HAVING PEROVSKITE FILMS

CROSS REFERENCE TO RELATED APPLICATIONS

This application is a national stage application of International Patent Application No. PCT/US2021/047532, filed Aug. 25, 2021, which claims the benefit of U.S. Provisional application Ser. No. 63/070,617, filed Aug. 26, 2020, the disclosures of which are incorporated herein by reference in their entirety, including any figures, tables, and drawings.

BACKGROUND

Cesium lead bromide ($CsPbBr_3$) has a direct band gap in the range of 2.16 electron Volts (eV) to 2.25 eV for bulk single crystals and about 2.3 eV for thin films. In addition to high stability, $CsPbBr_3$ possesses interesting electronic and optoelectronic properties such as high attenuation above the band gap, good photo response, large electron and hole mobility, long lifetimes, low excitation binding energy, halogen self-passivation, defect tolerance, and luminosity. Device quality single crystals have been prepared using high temperature processes, solution-based methods, and inverse temperature crystallization. The carrier concentration of solution grown crystals varies in the range $4.55 \times 10^7$ $cm^{-3}$ to $1.4 \times 10^8$ $cm^{-3}$ for holes and about $1.1 \times 10^9$ $cm^{-3}$ for electrons, making the crystals nearly intrinsic with resistivities in the range 1-3 giga-Ohms per centimeter (GΩ-cm). As a reference, Bridgman grown crystals show resistivities as high as about 340 GΩ-cm and mobility-lifetime ($\mu\tau$) product for electrons and holes in the range $1.7 \times 10^{-3}$ to $4.5 \times 10^{-4}$ square centimeters per Volt ($cm^2/V$) and $1.3 \times 10^{-3}$ to $9.5 \times 10^{-4}$ $cm^2/V$, respectively. These $\mu\tau$ values are better than that of CdZnTe (CZT) and CdTe. The electron $\mu\tau$ product of CZT and CdTe are in the lower range of the corresponding values for $CsPbBr_3$ while the hole $\mu\tau$ product is only 0.1% that of $CsPbBr_3$.

BRIEF SUMMARY

Embodiments of the subject invention provide novel and advantageous solid-state radiation detectors utilizing a film (e.g., inorganic and/or perovskite films) as an alpha detection layer. Alpha particle detection and/or neutron detection can be performed using a solid-state detector (e.g., a photoresistor, photodiode, or phototransistor). The detector can include a neutron conversion layer disposed thereon to enable neutron detection, and the neutron conversion layer can comprise a neutron detection material (e.g., boron-10 ($^{10}B$)). The film can detect alpha particles from the ambient environment or emitted by the neutron conversion layer (if present) so the device can detect alpha particles or neutrons, respectively. The film can generate electron-hole pairs and can be disposed near (e.g., in physical contact with) a semiconductor material, and in this way the alpha particles and/or neutrons can be detected electrically via contacts that are in electrical (and, optionally, physical) contact with the semiconductor material and/or the film. The semiconductor material can be, for example, $Ga_2O_3$ though embodiments are not limited thereto. The film can have a thickness of, for example, at least 100 nanometers (nm) (e.g., at least 1 micrometer (μm) or at least 5 μm) and can be a thick film or a thin film (e.g., thickness of 50 μm or less). A grain size of the film can be the same (or about the same) as a thickness of the film. The film can be, for example, a material with the formula $A^1A^2X_3$, where $A^1=CH_3NH_3$, $CH_2(NH_2)_2$, or cesium (Cs); $A^2$=lead (Pb) or tin (Sn); and X=chlorine (Cl), bromine (Br), or iodine (I)). The film can be, for example, a $CsPbB_3$ film.

In an embodiment, a radiation detector can comprise: a substrate; and a perovskite film disposed on the substrate and capable of detecting alpha particles, wherein the perovskite film has a thickness in a range of from 100 nm to 50 μm. The radiation detector can further a neutron conversion material (e.g., $^{10}B$) disposed on the perovskite film. The perovskite film can have the formula $A^1A^2X_3$, where $A^1=CH_3NH_3$, $CH_2(NH_2)_2$, or Cs; $A^2$=Pb or Sn; and X=Cl, Br, or I). The perovskite film can be $CsPbBr_3$, methylammonium (MA) lead bromide ($MAPbBr_3$), MA lead chloride ($MAPbCl_3$), or $CsPbCl_3$. The thickness of the perovskite film can be in a range of from 100 nm to 10 μm (e.g., in a range of from 1 μm to 10 μm). The radiation detector can further comprise a semiconductor material (e.g., $Ga_2O_3$) on which the perovskite film is disposed. The radiation detector can further comprise a first contact (e.g., comprising gold) disposed on the perovskite film and a second contact (e.g., comprising indium tin oxide) disposed on the substrate. The radiation detector can further comprise an anode and a cathode electrically connected to the first contact. The first contact can comprise a plurality of first contacts and/or the second contact can comprise a plurality of second contacts. The anode can be electrically connected to one of the first contacts and the cathode can be electrically connected to another of the first contacts. The perovskite film can be in direct physical contact with the semiconductor material. The perovskite film can be deposited using a close space sublimation (CSS) process. A grain size of the perovskite film can be the same as the thickness of the perovskite film. The radiation detector can further comprise a conductive material between the substrate and semiconductor material. The radiation detector can be a photoresistor including a first contact and a second contact disposed on the perovskite film. The radiation detector can be a phototransistor including a gate disposed on the substrate, a gate dielectric disposed on the gate, an oxide semiconductor disposed on the gate dielectric, and a source and a drain disposed on the oxide semiconductor, wherein the perovskite film is disposed on the oxide semiconductor.

In another embodiment, a method of detecting alpha particles can comprise: providing a radiation detector as disclosed herein; and using the radiation detector to detect alpha particles. In yet another embodiment, a method of detecting neutrons can comprise: providing a radiation detector as disclosed herein (and including a neutron conversion material disposed on the film); and using the radiation detector to detect neutrons.

BRIEF DESCRIPTION OF DRAWINGS

FIG. 1(a) shows a schematic view of a radiation sensitive thin film photoresistor, according to an embodiment of the subject invention. The thin film is labeled in the figure as "Perovskite film". Though the figure refers to the substrate as glass and the contacts as metal, these are for exemplary purposes only; other materials can be used (e.g., other conductive materials for the contacts).

FIG. 1(b) shows a schematic view of a radiation sensitive thin film photodiode, according to an embodiment of the subject invention. The thin film is labeled in the figure as "Perovskite film". Though the figure refers to the substrate as glass, the contacts as metal, the semiconductor as $Ga_2O_3$, and the bottom contact as indium tin oxide (ITO), these are for exemplary purposes only; other materials can be used.

FIG. 1(c) shows a schematic view of a radiation sensitive thin film phototransistor, according to an embodiment of the subject invention. The thin film is labeled in the figure as "Perovskite film". Though the figure refers to $SiO_2$ as the gate dielectric, this is for exemplary purposes only; other materials can be used.

FIG. 2 shows a schematic view of a photodiode having a thin film (labeled in FIG. 2 as $CsPbBr_3$), according to an embodiment of the subject invention. The cathode (+) and anode (−) are labeled, as are the electrical contacts (ITO and gold). A semiconductor material can be used (e.g., $Ga_2O_3$, such as n-type $Ga_2O_3$). Though the figure refers to the thin film being $CsPbBr_3$, the electrical contacts being ITO and gold, and the semiconductor being $Ga_2O_3$, these are for exemplary purposes only; other materials can be used.

DETAILED DESCRIPTION

Embodiments of the subject invention provide novel and advantageous solid-state radiation detectors utilizing a film (e.g., inorganic and/or perovskite films) as an alpha detection layer. Alpha particle detection and/or neutron detection can be performed using a solid-state detector (e.g., a photoresistor, photodiode, or phototransistor). The detector can include a neutron conversion layer disposed thereon to enable neutron detection, and the neutron conversion layer can comprise a neutron detection material (e.g., boron-10 ($^{10}$B)). The film can detect alpha particles from the ambient environment or emitted by the neutron conversion layer (if present) so the device can detect alpha particles or neutrons, respectively. The film can generate electron-hole pairs and can be disposed near (e.g., in physical contact with) a semiconductor material, and in this way the alpha particles and/or neutrons can be detected electrically via contacts that are in electrical (and, optionally, physical) contact with the semiconductor material and/or the film. The semiconductor material can be, for example, Ga$_2$O$_3$, though embodiments are not limited thereto. The film can have a thickness of, for example, at least 100 nanometers (nm) (e.g., at least 1 micrometer (μm) or at least 5 μm) and can be a thick film or a thin film (e.g., thickness of 50 μm or less). A grain size of the film can be the same (or about the same) as a thickness of the film. The film can be, for example, a material with the formula A$^1$A$^2$X$_3$, where A$^1$=CH$_3$NH$_3$, CH$_2$(NH$_2$)$_2$, or cesium (Cs); A$^2$=lead (Pb) or tin (Sn); and X=chlorine (Cl), bromine (Br), or iodine (I)). The film can be, for example, a CsPbB$_3$ film.

When the term "approximately" or "about" is used herein, in conjunction with a numerical value, it is understood that the value can be in a range of 95% of the value to 105% of the value, i.e. the value can be +/−5% of the stated value. For example, "about 1 kg" means from 0.95 kg to 1.05.

FIG. 1(a) shows a schematic view of a radiation sensitive thin film photoresistor, according to an embodiment of the subject invention. The photoresistor can include a film disposed on a substrate with two contacts disposed on the film. FIG. 1(c) shows a schematic view of a radiation sensitive thin film phototransistor, according to an embodiment of the subject invention. The phototransistor can include a gate dielectric disposed on a gate, an oxide semiconductor disposed on the gate dielectric, and the film, a source, and a drain all disposed on the oxide semiconductor.

Figures 7A, 7B:
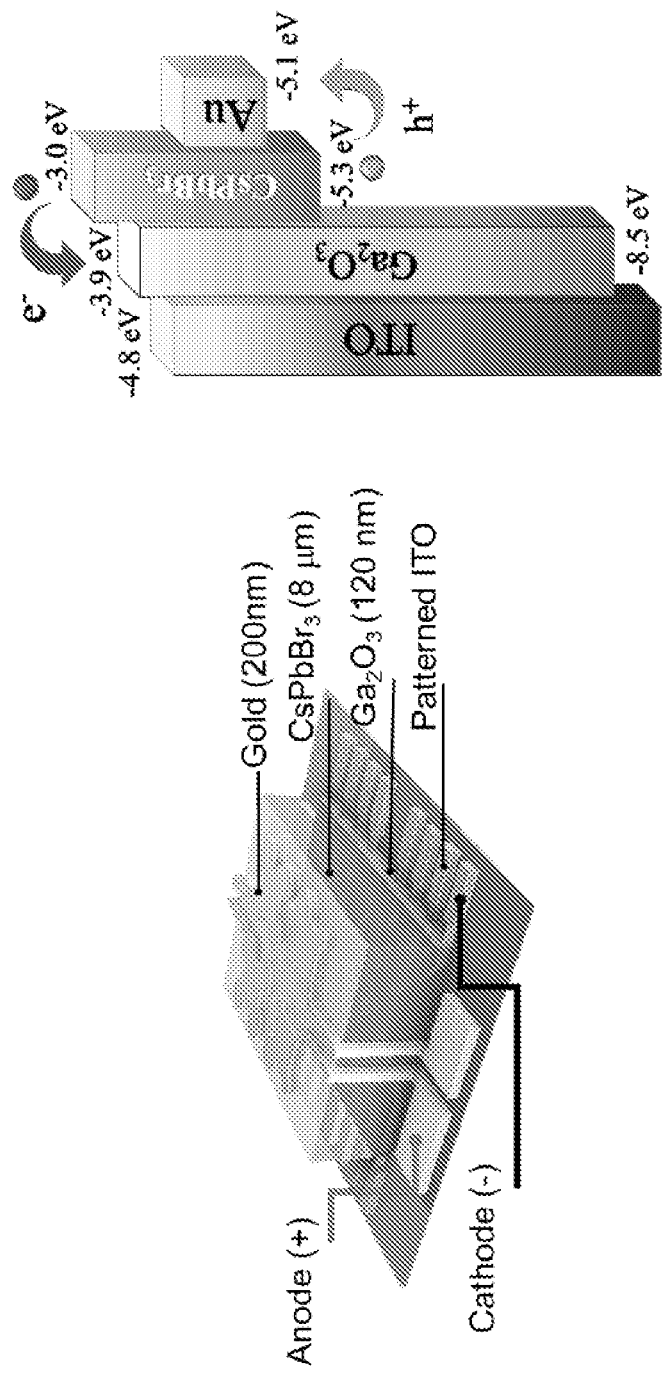
FIG. 7(a) shows a schematic view of a photodiode having a thin film (labeled in FIG. 7(a) as $CsPbBr_3$, according to an embodiment of the subject invention. The cathode (+) and anode (−) are labeled, as are the electrical contacts (patterned ITO and gold). A semiconductor material can be used (e.g., $Ga_2O_3$, such as n-type $Ga_2O_3$). Though the figure refers to the thin film being $CsPbBr_3$, the electrical contacts being ITO and gold, and the semiconductor being $Ga_2O_3$, these are for exemplary purposes only; other materials can be used. In addition, FIG. 7(a) shows thicknesses for the top contact (200 nanometers (nm)), the thin film (8 micrometers (μm)), and the semiconductor (120 nm), but these are also for exemplary purposes only; other thicknesses can be used.
FIG. 7(b) shows a schematic view illustrating band gaps and band edge positions of different layers, determined experimentally, for the photodiode of FIG. 7(a), with the materials as referenced in FIG. 7(a).

FIG. 1(b) shows a schematic view of a radiation sensitive thin film photodiode, according to an embodiment of the subject invention. FIG. 2 also shows a schematic view of a photodiode having a thin film (labeled in FIG. 2 as CsPbBr$_3$), according to an embodiment of the subject invention. In addition, FIG. 7(a) shows a schematic view of a photodiode having a thin film (labeled in FIG. 7(a) as CsPbBr$_3$), according to an embodiment of the subject invention. FIG. 7(b) shows a schematic view illustrating band gaps and band edge positions of different layers (determined experimentally) for the photodiode of FIG. 7(a), with the materials as referenced in FIG. 7(a).

Referring to FIGS. 1(b), 2, and 7(a), a photodiode can include a semiconductor material disposed on a substrate, a film disposed on the semiconductor material, a first contact disposed on the film, and a second contact disposed on the substrate next to the semiconductor material. The photodiode can also include a conductive material (e.g., indium tin oxide (ITO)) between the substrate and the semiconductor material, and the second contact can be disposed on the conductive material (or can be extended from and part of (i.e., the same material as and in direct physical contact with) the conductive material). The first contact can be a metal material (e.g., gold (Au)), though embodiments are not limited thereto. The semiconductor material can be, for example, Ga$_2$O$_3$, though embodiments are not limited thereto. The film can be, for example, CsPbB$_3$, though embodiments are not limited thereto. The second contact can be, for example, ITO, though embodiments are not limited thereto. A plurality of first contacts and/or a plurality of second contacts can be provided, as seen in FIGS. 2 and 7(a). The photodiode can further include a cathode and an anode.

Figure 5:
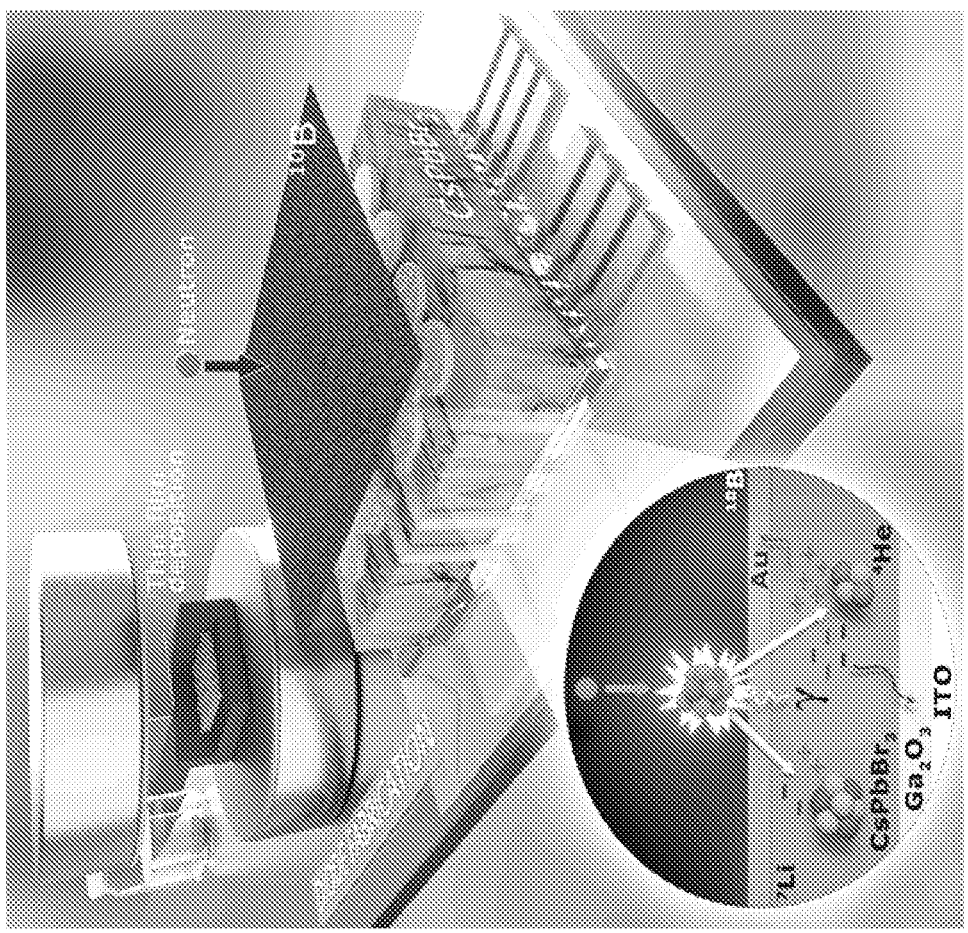
FIG. 5 shows a schematic view of a neutron detector having a thin film (labeled in FIG. 5 as $CsPbBr_3$), according to an embodiment of the subject invention. The thin film deposition apparatus used for depositing the thin film is also shown in the background. The detector can include a neutron detection material (e.g., boron-10 ($^{10}B$)), which emits one or more alpha particles (γ) when struck with a neutron. The inset shows the mechanism of detection, with the neutron striking the neutron detection material, which emits an γ that then causes electron and hole pairs in the thin film, which can be detected electrically. Though FIG. 5 refers to specific materials for the neutron detection material ($^{10}B$), the thin film ($CsPbBr_3$), the semiconductor ($Ga_2O_3$), and the contacts (gold (Au) and ITO), these are for exemplary purposes only and should not be construed as limiting.

FIG. 5 shows a schematic view of a neutron detector having a film (labeled in FIG. 5 as CsPbBr3), according to an embodiment of the subject invention. The film deposition apparatus used for depositing the thin film is also shown in the background. The film can be deposited using a close space sublimation (CSS) process, in which a source material to be sublimated can be provided in a container, and the container (e.g., a crucible) can be disposed on a bottom heater (while containing the material to be sublimated). The substrate onto which the film is to be deposited can be positioned above the container. The substrate can be in direct physical contact with a top heater, and the temperatures of the container and the substrate can be independently controlled (e.g., using thermocouple sensors or similar temperature control devices), and the temperature of the container can be kept higher than the temperature of the substrate.

Referring still to FIG. 5, the detector can include a neutron detection material (e.g., $^{10}B$), which emits one or more alpha particles (γ) when struck with a neutron. The inset shows the mechanism of detection, with the neutron striking the neutron detection material, which emits an γ that then causes electron and hole pairs in the thin film, which can be detected electrically.

Figure 14:
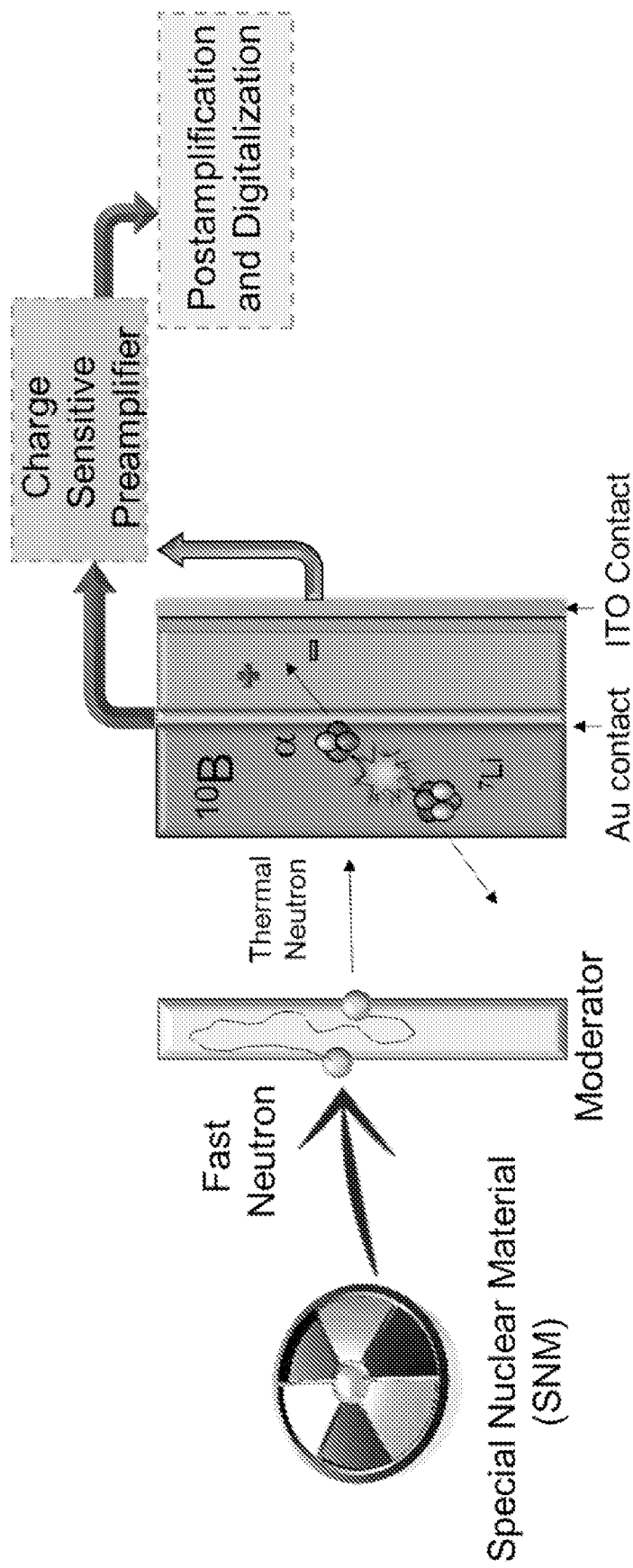
FIG. 14 is a schematic view illustrating operation of a solid-state neutron detector according to an embodiment of the subject invention. Thermal neutrons are captured in the neutron conversion layer (e.g., $^{10}$B conversion layer) after the fast neutrons are moderated. Alpha particles produced in the neutron conversion layer and are collected in the depletion region of the solid state detector (depicted in the figure as the box between the Au contact and the ITO contact; this can be, e.g., a photodiode according to an embodiment of the subject invention, such as a Ga$_2$O$_3$/CsPbBr$_3$ diode) and processed by the preamplifier (labeled as "charge sensitive preamplifier") and multichannel analyzer (MCA; labeled as "postamplification and digitalization"). Though FIG. 14 refers to certain materials for the contacts and the neutron conversion layer, these are for exemplary purposes only and should not be construed as limiting.

FIG. 14 is a schematic view illustrating operation of a solid-state neutron detector according to an embodiment of the subject invention. Thermal neutrons can be captured in the neutron conversion layer (e.g., $^{10}B$ conversion layer) after the fast neutrons are moderated (e.g., using a moderator disposed above the neutron conversion layer). Alpha particles produced in the neutron conversion layer can be collected in the depletion region of the solid state detector (depicted in the figure as the rectangle between the Au contact and the ITO contact; this can be, e.g., a photodiode according to an embodiment of the subject invention, such as a $Ga_2O_3$/$CsPbBr_3$ diode) and processed by the preamplifier (labeled as "charge sensitive preamplifier") and multichannel analyzer (MCA; labeled as "postamplification and digitalization").

In certain embodiments, the film can be subjected to a chemical or thermal treatment (e.g., a thermal treatment in a vapor of a chemical, such as $PbCl_2$ vapor). This can result in, for example, a mix halide film.

While related art solid-state radiation detectors sensors typically utilize single crystals, embodiments of the subject invention use films (e.g., thin films) for low-cost and large area device applications. Alpha particle and/or neutron detection can be performed using a solid-state detector (e.g., a semiconductor-film solid-state diode). The film can be prepared by, for example, a CSS method. The solid-state detector can be, for example, a $Ga_2O_3$/$CsPbBr_3$ solid-state diode. In addition, indirect neutron sensing can be achieved using a neutron conversion layer (e.g., a $^{10}B$ layer).

Perovskites of the formula $A^1A^2X_3$ (where $A^1$=$CH_3NH_3$, $CH_2(NH_2)_2$, or Cs; $A^2$=Pb or Sn; and X=Cl, Br, or I) have advantageous properties, including tunable direct band gap and emission wavelengths, large absorption coefficient, high electron/hole mobilities, long carrier lifetime and diffusion lengths, simple processing techniques, and ease of integration with both organic and inorganic semiconductor materials. These excellent features make these perovskite materials ideal for device applications such as radiation detectors. No related art devices use thin film perovskite containing devices for radiation detection, such as alpha particle and/or neutron detection. Embodiments of the subject invention provide solid-state radiation detectors utilizing a perovskite film as an alpha detection layer, possibly in combination with a neutron conversion layer to allow for neutron detection. A PN junction (photodiode) can use a perovskite film as the active layer. Alpha and thermal neutron detection can be performed using hybrid and inorganic perovskites such as $CsPbBr_3$, methylammonium (MA) lead bromide (MAPbBr$_3$), MA lead chloride (MAPbCl$_3$), or CsPbCl$_3$. Although alpha and neutron sensing using a CsPbBr$_3$ photodiode is discussed extensively herein, this is for exemplary purposes only; this should not be construed as limiting the material of the film.

Embodiments of the subject invention provide devices for radiation detection including perovskite films (e.g., thin films). Photodiode thin film devices, photoresistor thin film devices, and phototransistor thin film devices can incorporate perovskite materials as the active sensor for radiation detection. Particles (e.g., alphas, neutrons, photons), gamma radiation, and/or ultraviolet (UV) radiation detection can be performed using thin film perovskite devices. A thin film PN junction can be used for thermal neutron and/or alpha detection. A wide band gap material (e.g., n-type material) (e.g., $Ga_2O_3$) can be used together with perovskite material to form radiation sensitive devices. Cs-containing perovskites can be used for radiation detection, and mix halides perovskite materials can be used for thermal neutron detection. The fabrication process is compatible with large scale manufacturing, such as flat panel display (FPD) manufacturing technologies.

A greater understanding of the embodiments of the subject invention and of their many advantages may be had from the following examples, given by way of illustration. The following examples are illustrative of some of the methods, applications, embodiments, and variants of the present invention. They are, of course, not to be considered as limiting the invention. Numerous changes and modifications can be made with respect to the invention.

MATERIALS AND METHODS

Diodes were fabricated using $Ga_2O_3$ as an n-type semiconductor and deposited on a patterned (photo-lithography) ITO (thickness of about 140 nm) substrate, which also served as one of the contacts (see, e.g., FIGS. 7(a) and 7(b)). $Ga_2O_3$ (thickness of about 120 nm) was deposited by radio frequency (RF) sputtering from a $Ga_2O_3$ target acquired from Kurt J. Lesker Company. The deposition was carried out at room temperature using a sputter power density of 17.83 watts per square centimeter (W/cm$^2$) under 100% argon (Ar) ambient and a total pressure of 3 milliTorr (mTorr). Prior to deposition, all substrates were cleaned in an ultrasonic bath using acetone, isopropanol, and deionized water in that order, and dried with $N_2$ gas. A photolithographic process defined the size of both the ITO and $Ga_2O_3$ layers and hence the diode size (250 μm, 500 μm, 1 mm, and 2 mm). The CsPbBr$_3$ film (about 8 μm thick) was deposited by CSS on top of the ITO/Ga$_2$O$_3$. The top contact, which was 200 nm thick Au, was deposited through a shadow mask in an e-beam evaporator at a rate of 0.1 Angstroms per second (Å/s).

The I-V and C-V characteristics were measured using a probe station (Cascade SUMMIT 11741B-HT), Keithley 4200, and HP 4280A. The C-V measurements were carried out at a frequency of 100 kilohertz (kHz). Carrier concentration, resistivity, and mobility for the CsPbBr$_3$ films deposited on glass were measured by the Hall Effect using the van der Pauw method and a Lakeshore 8404 system with a direct current (DC) field strength of 0.5 Tesla (T). UV-vis measurements were carried out to estimate the $E_g$ of the CSPbBr$_3$ films. The work-functions (Φ) of the $Ga_2O_3$ and CsPbBr$_3$ films deposited on conductive (ITO) substrates were measured by the Kelvin probe (SKP 5050, KP Technology) technique with Au as the reference material (Φ=5.15 eV). The valance band position was measured by PESA using a Riken Keiki AC-2 photoelectron spectrometer equipped with a deuterium lamp of 100 nanowatts (nW) power and with a step size of 0.05 eV. Morphology and crystalline structure of the films were determined using SEM (Zeiss Supra-40 microscope) and GIXRD (Rigaku Ultima III X-ray diffractometer at grazing incident angles 0.5° and 2.0°, respectively. The X-ray photoelectron spectroscopy (XPS) measurements were performed using a PHI 5000 Versa Probe II. All the analyses were taken at a 90° take-off angle with respect to the sample surface. A monochromatic Al Kα radiation source (hv=1486.6 eV) with a 0.1 eV step size and a pass energy of 23.50 eV was used. The base pressure in the analysis chamber was $1.6\times10^{-8}$ Torr. All binding energies are relative to the C 1s peak at 284.8 eV. Photoluminescence (PL) was recorded with an in-house built system and using neutral density filters.

For the radiation detection experiments, an aluminum box containing a printed circuit board (PCB) was used to accommodate the detector. The PCB allowed the detector to be centered with the source to ensure reproducibility. The diode was connected to the ORTEC 109A preamplifier, which connected to the shaping amplifier (ORTEC Model 572), and its output was acquired by an OTRTEC EASY-MCA-2k multichannel analyzer. The diode was biased at −5 V for both alpha and neutron detection.

EXAMPLE 1

Figure 6:
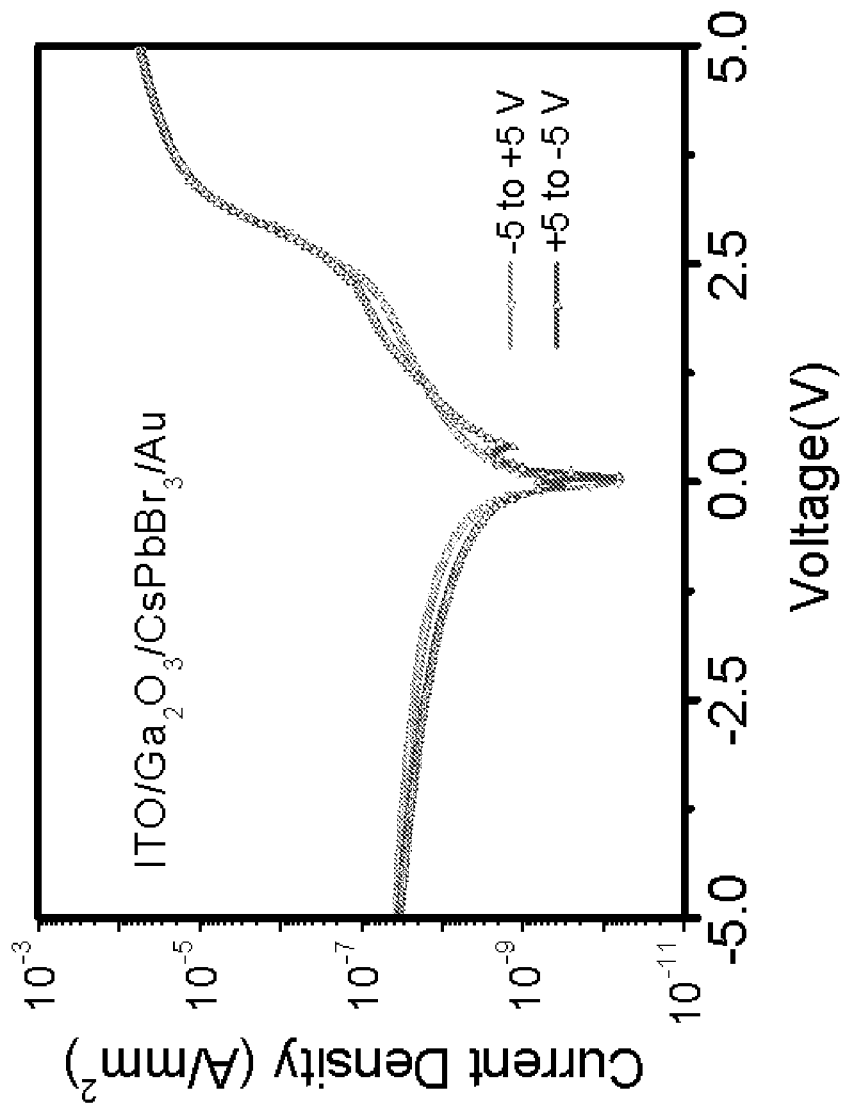
FIG. 6 shows a plot of current density (in amps per square millimeter ($A/mm^2$) versus voltage (in V) for the photodiode shown in FIG. 2, with ITO and Au contacts, a $Ga_2O_3$ semiconductor, and a $CsPbBr_3$ thin film. The I-V scans in the range of −5 V to +5 V shows minimal hysteresis in the $CsPbBr_3$ film. The (green) curve that is slightly higher around −1 V is for the scan from −5 V to +5 V, and the (blue) curve that is slightly lower around −1 V is for the scan from +5 V to −5 V.
Figure 8:
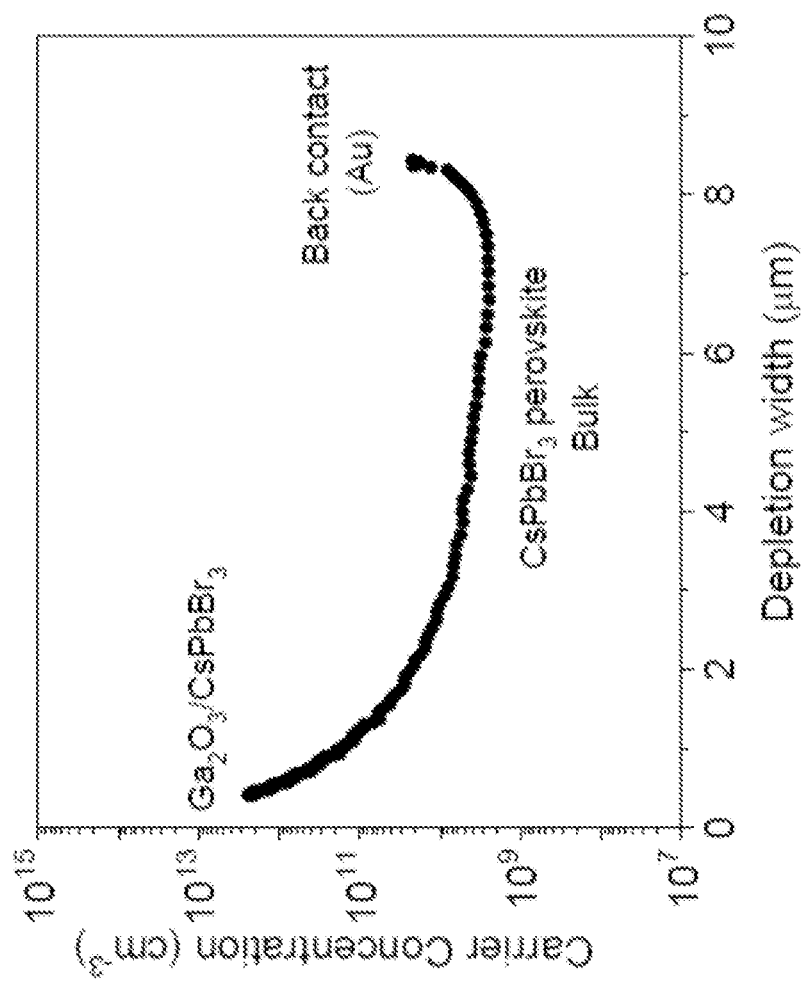
FIG. 8 shows a plot of carrier concentration (in 1/centimeters$^3$ ($1/cm^3$)) versus depletion width (in μm) giving the depth profile of carrier concentration estimated from C-V data measured at 100 kilohertz (kHz) for the photodiode of FIG. 7(a), with the materials as referenced in FIG. 7(a). At the left is the $Ga_2O_3/CsPbBr_3$ boundary, in the middle is the $CsPbBr_3$ perovskite bulk, and at the right is the back contact (Au).

In order to demonstrate charged particle sensing, a p-n junction diode as shown in FIG. 2 was fabricated, with the ITO/Ga$_2$O$_3$/CsPbBr$_3$/Au. The resulting diode showed a leakage (reverse bias) current of $5\times10^{-8}$ A/mm$^2$ and was fully depleted at −5 V (see inset of FIG. 3(a)) with negligible I-V hysteresis (see FIG. 6) and a rectification of $10^4$. A schematic of the device configuration and the band structure are shown in FIGS. 7(a) and 7(b), respectively. Conduction (Ec) and valence band (Ev) edge energies of −3.0 eV and −5.3 eV, respectively, were estimated for the CsPbBr$_3$ film using data from photo electron spectroscopy in air (PESA), Kelvin probe, and optical transmittance. Based on Hall measurements, the resistivity, mobility, and carrier concentration for the CsPbBr$_3$ film were determined as $1\times10^{11}$ Ohm-centimeters (Ω-cm), 0.013 square centimeters per Volt-second (cm$^2$/(V-s)), and $5\times10^9$ cm$^{-3}$, respectively. The corresponding values for the n-Ga$_2$O$_3$ were about $5\times10^6$ Ω-cm, 1 cm$^2$/(V-s) and about $10^{15}$ cm$^{-3}$, respectively. Capacitance profiling of the Ga$_2$O$_3$/CsPbBr$_3$ device showed that the carrier concentration near the interface was almost three orders higher than that in the bulk, which indicates a higher concentration of defect or impurity levels (see FIG. 8). However, the carrier concentration in the bulk was maintained at about $3\times10^9$ cm$^{-3}$, which coincides with the value obtained from Hall Effect measurement. The favorable band alignments and the high band gap of Ga$_2$O$_3$ enabled low leakage current and diode rectification of greater than $10^4$ (FIG. 3(a)), which is significantly superior to that of for CsPbBr$_3$/ZnO and ZnO/CsPbBr$_3$/MoO$_3$ diodes (see also [45], [46]).

Figures 3A, 3B, 3C, 3D:
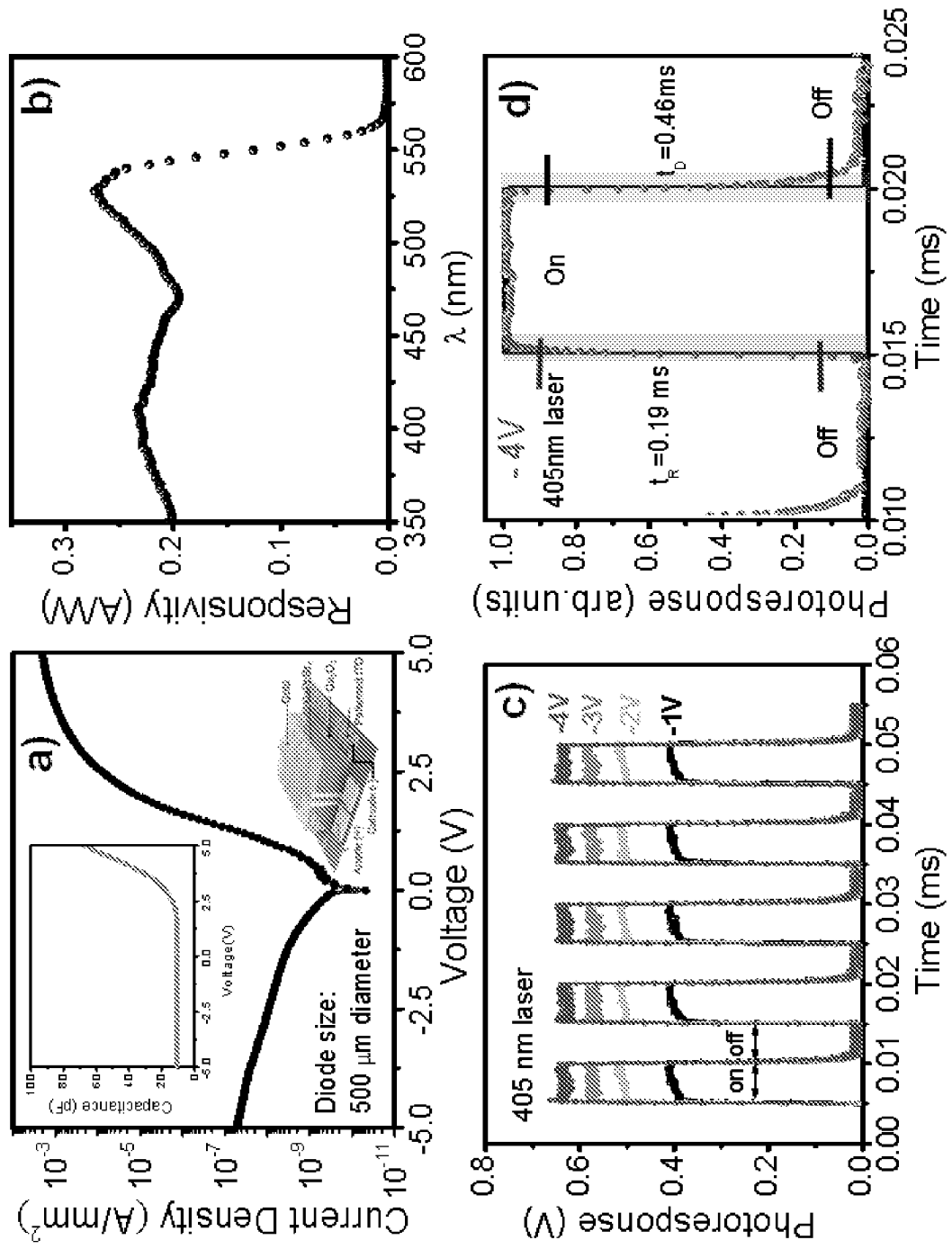
FIG. 3(a) shows a plot of current density (in Amps per square millimeter ($A/mm^2$) versus voltage (in Volts (V)) for the $Ga_2O_3/CsPbBr_3$ thin film diode shown in FIG. 2. The inset plot of FIG. 3(a) shows the complete depletion of the device with a $CsPbBr_3$ film having a thickness of about 8 μm, at low reverse bias. The inset schematic is of the same device as shown in FIG. 2.
FIG. 3(b) shows a plot of responsivity (in Amps per Watt (A/W)) versus wavelength (in nm) for the $Ga_2O_3/CsPbBr_3$ thin film diode shown in FIG. 2, measured at −4 V applied bias.
FIG. 3(c) shows a plot of photoresponse (in V) versus time (in milliseconds (ms)) for the $Ga_2O_3/CsPbBr_3$ thin film diode shown in FIG. 2, under different applied biases. The lowest photoresponse in each grouping is for an applied bias of −1 V; the second-lowest photoresponse in each grouping is for an applied bias of −2 V; the third-lowest photoresponse in each grouping is for an applied bias of −3 V; and the highest photoresponse in each grouping is for an applied bias of −4 V.
FIG. 3(d) shows a plot of photoresponse (in a.u.) versus wavelength (in nm) for the $Ga_2O_3/CsPbBr_3$ thin film diode shown in FIG. 2, showing the rise/decay time estimation. The applied bias is −4 V.

The spectral responsivity, photo response, and rise and decay times for the CsPbBr$_3$ diode are shown in FIGS. 3(b)-3(d). The responsivity peak at 528 nm coincides with the absorption spectrum. The responsivity at −4 V bias was 273 milliamps per Watt (mA/W) (see FIG. 3(b)), which is comparable with that of a ZnO/CsPbBr$_3$/GaN diode and higher than that of CsPbBr$_3$ nanocrystals and ZnO/Ga$_2$O$_3$/Ti diodes (see also [47]). The device showed an on/off ratio of $10^2$ at −4 V (E=5 kV/cm) when exposed to a 405 nm laser (FIG. 3(d)).

The estimated rise/decay time for the diode was 190/460 μm, which is much shorter than expected for CsPbBr$_3$-based diodes and photoresistors (see also [45], [46], [17], [19], [48]). The superior performance of the fabricated devices, even without a hole transport layer, is attributed to the phase purity, large columnar grains of the CSS deposited CsPbBr$_3$ films, as well as the large band gap of the Ga$_2$O$_3$ n-layer.

Figures 9A, 9B:
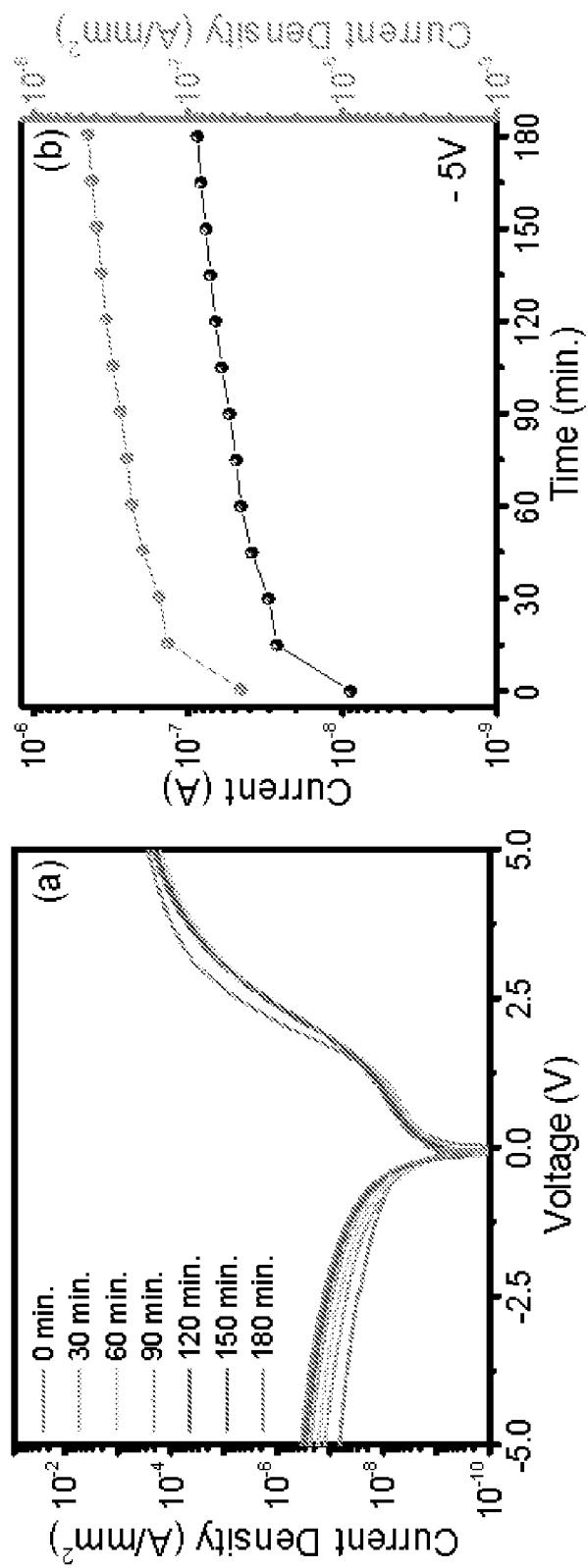
FIG. 9(a) shows a plot of current density (in $A/mm^2$) versus voltage (in V) for the photodiode of FIG. 7(a), with the materials as referenced in FIG. 7(a), recorded at 30 minute intervals. The (red) curve with the lowest value at a voltage of −5 V is for 0 minutes (min); the (orange) curve with the second-lowest value at a voltage of −5 V is for 30 min; the (yellow) curve with the third-lowest value at a voltage of −5 V is for 60 min; the (green) curve with the fourth-lowest value at a voltage of −5 V is for 90 min; the (blue) curve with the fifth-lowest value at a voltage of −5 V is for 120 min; the (light purple) curve with the second-highest value at a voltage of −5 V is for 150 min; and the (dark purple) curve with the highest value at a voltage of −5 V is for 180 min.
FIG. 9(b) shows a plot of current (in Amps (A)) and current density (in $A/mm^2$) versus time (in min) for the photodiode of FIG. 7(a), with the materials as referenced in FIG. 7(a), under an applied bias of −5 V. The (red) curve that is higher in the plot is for the current density, and the (black) curve that is lower in the plot is for the current.
Figures 10A, 10B, 10C, 10D:
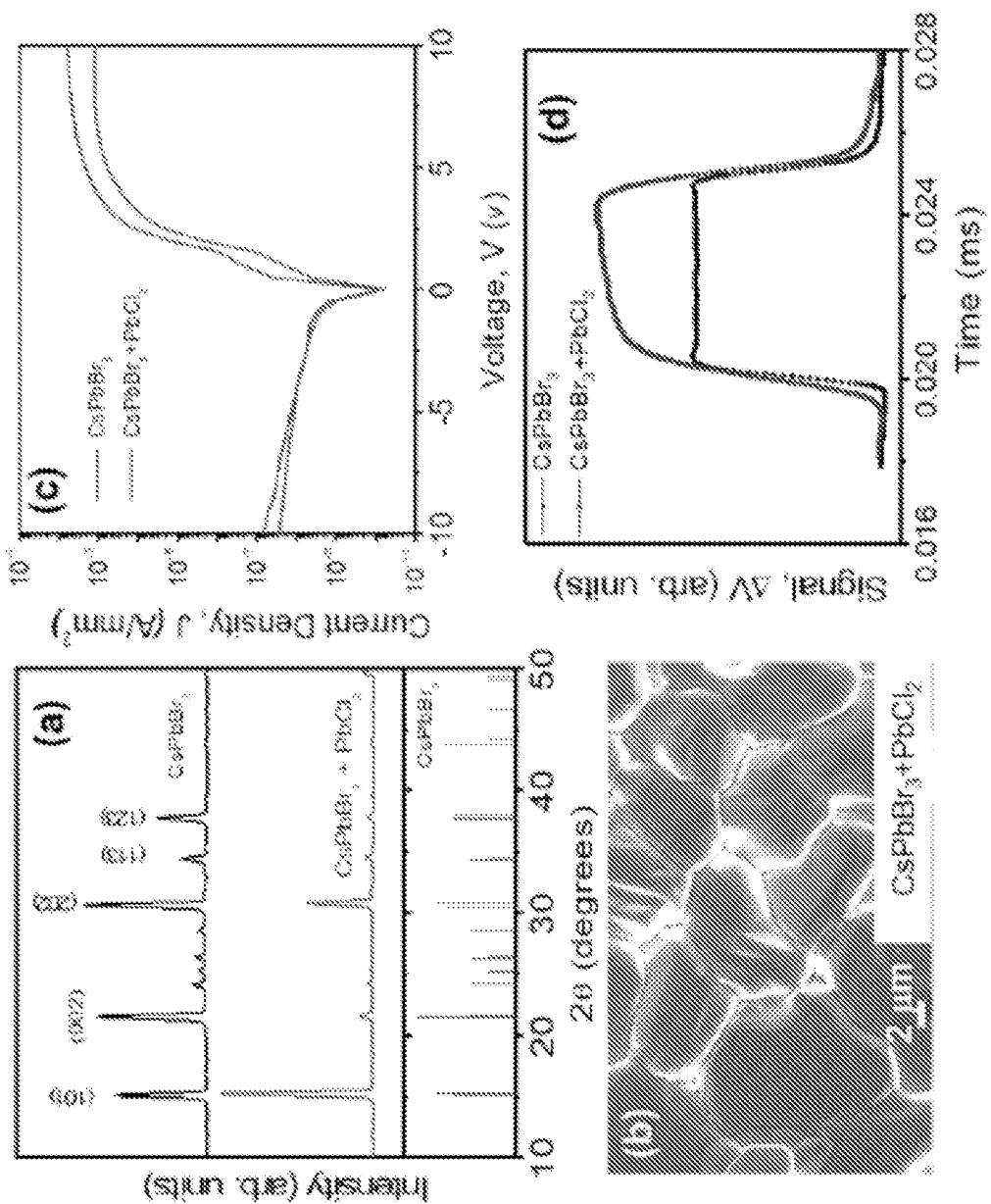
FIG. 10(a) shows X-ray diffraction (XRD) patterns of a CsPbBr3 thin film before and after a treatment with $PbCl_2$, according to embodiments of the subject invention. The top shows a reference XRD, the middle is after the PbCl$_2$ treatment, and the bottom is before the PbCl$_2$ treatment.
FIG. 10(b) shows a top-view scanning electron microscope (SEM) image of the CsPbBr3 after treatment with PbCl$_2$. The scale bar is 2 µm.
FIG. 10(c) shows a plot of current density (in A/mm$^2$) versus voltage (in V) for the CsPbBr$_3$ thin film, before and after a treatment with PbCl$_2$. The (blue) curve that has higher current density at a voltage of 5 V is for the CsPbBr$_3$ thin film before treatment with PbCl$_2$, and the (red) curve that has lower current density at a voltage of 5 V is for the CsPbBr$_3$ thin film after treatment with PbCl$_2$.
FIG. 10(d) shows a plot of signal (ΔV, in a.u.) versus time (in ms) giving the photo response of CsPbBr$_3$ and CsPbBr$_3$—XCl$_y$ (e.g., CsPbBr$_3$—PbCl$_2$) based devices. The (blue) curve that is higher is for CsPbBr$_3$, and the (black) curve that is lower is for CsPbBr$_3$ after treatment with PbCl$_2$.

The diode stability was evaluated using a constant voltage stress for 180 minutes at a bias of −5 V, and the I-V characteristics were evaluated every 30 minutes. The diode characteristics remained fairly constant regardless of the stress (see FIGS. 9(a) and 9(b)). The leakage current showed a change of one order of magnitude under these test conditions, while the forward current remained basically unchanged.

Selected diodes were submitted to a grain boundary passivation treatment using PbCl$_2$ as a source of chloride that resulted in mix-halide perovskite (CsPbBr$_{3-x}$Cl$_x$) with an orthorhombic structure and larger grain size that led to an improved diode behavior. After the chloride treatments the diode on/off ratio increased by 11%, which can lead to higher detection efficiency of the devices (see FIGS. 10(a)-10(d), and particularly 10(d)).

EXAMPLE 2

The diodes were evaluated as charged particle detectors, specifically for thermal neutron sensing using a $^{10}$B layer as a neutron conversion layer/film. Neutron detectors normally include a conversion material such as $^{10}$B in which a transmutation reaction produces an ionizing particle that in turn creates electron-hole pairs in the detector material (see also [49]). The transmutation reaction includes a neutron captured by the $^{10}$B that then becomes $^{11}$B in an excited state that splits into $^7$Li and an alpha particle ($^4$He) as shown in the reaction from Equation 1 ([49]).

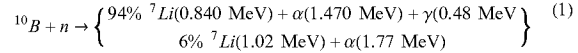

$$^{10}B + n \rightarrow \begin{cases} 94\% \ ^7Li(0.840 \text{ MeV}) + \alpha(1.470 \text{ MeV}) + \gamma(0.48 \text{ MeV}) \\ 6\% \ ^7Li(1.02 \text{ MeV}) + \alpha(1.77 \text{ MeV}) \end{cases} \quad (1)$$

Figure 11A:
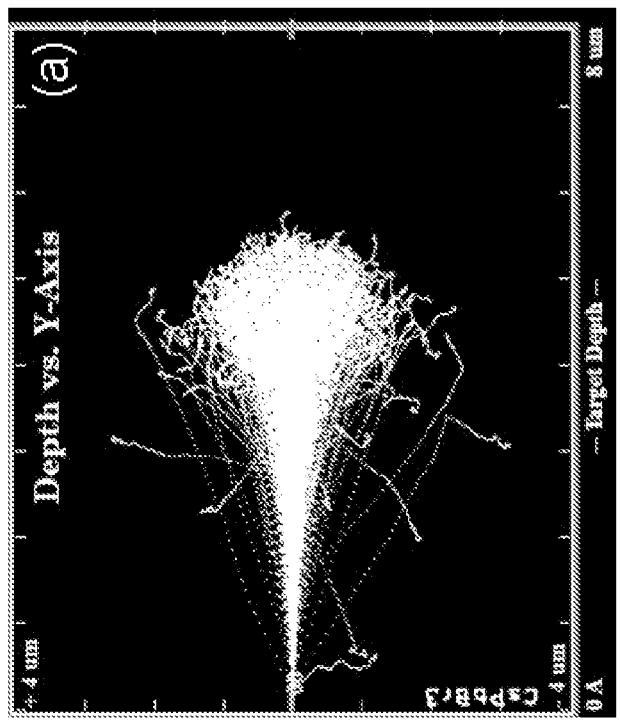
FIG. 11(a) shows a plot of y-axis of material (in µm) versus depth of material (in µm) showing simulation results for alpha particle attenuation in CsPbBr$_3$ target material. The simulation was performed using Stopping and Range of Ions in Matter (SRIM) software. This figure shows ion distribution inside the target after absorption.
Figure 11B:
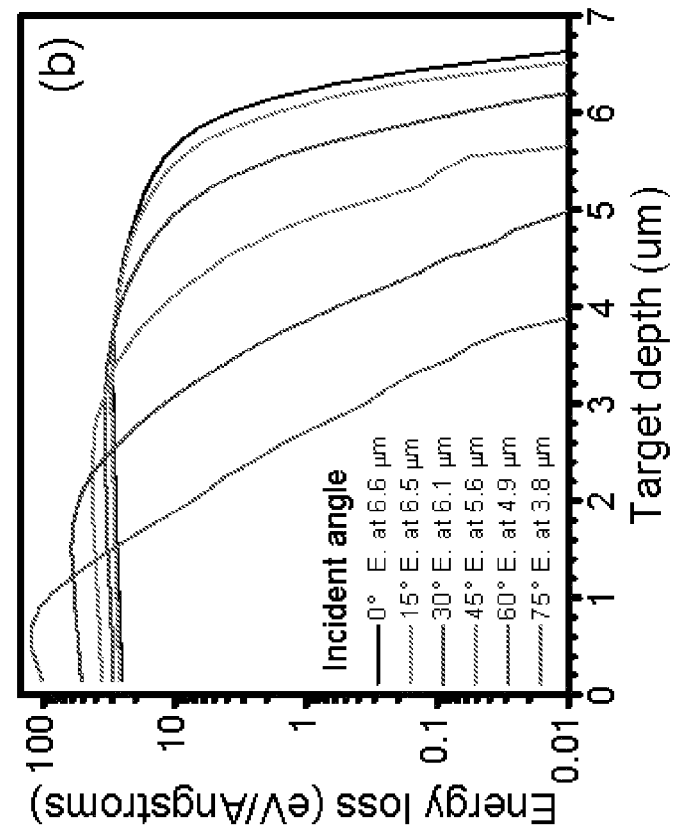
FIG. 11(b) shows a plot of energy loss (in electron Volts per Angstrom (eV/Angstrom)) versus target depth (in µm) at different incident angles. This shows simulation results (using SRIM) of alphas with energy of 1.47 mega-eV (MeV) in the CsPbBr$_3$ target at different incident angles. The (black) curve that is rightmost at energy loss of 0.01 eV/Angstrom is for 0° (E. at 6.6 µm); the (red) curve that is second-to-the-rightmost at energy loss of 0.01 eV/Angstrom is for 15° at (E. at 6.5 µm); the (blue) curve that is third-to-the-rightmost at energy loss of 0.01 eV/Angstrom is for 30° at (E. at 6.1 µm); the (green) curve that is fourth-to-the-rightmost at energy loss of 0.01 eV/Angstrom is for 45° at (E. at 5.6 µm); the (maroon) curve that is second-to-the-leftmost at energy loss of 0.01 eV/Angstrom is for 60° at (E. at 4.9 µm); and the (purple) curve that is leftmost at energy loss of 0.01 eV/Angstrom is for 75° at (E. at 3.8 µm).
Figures 12A, 12B:
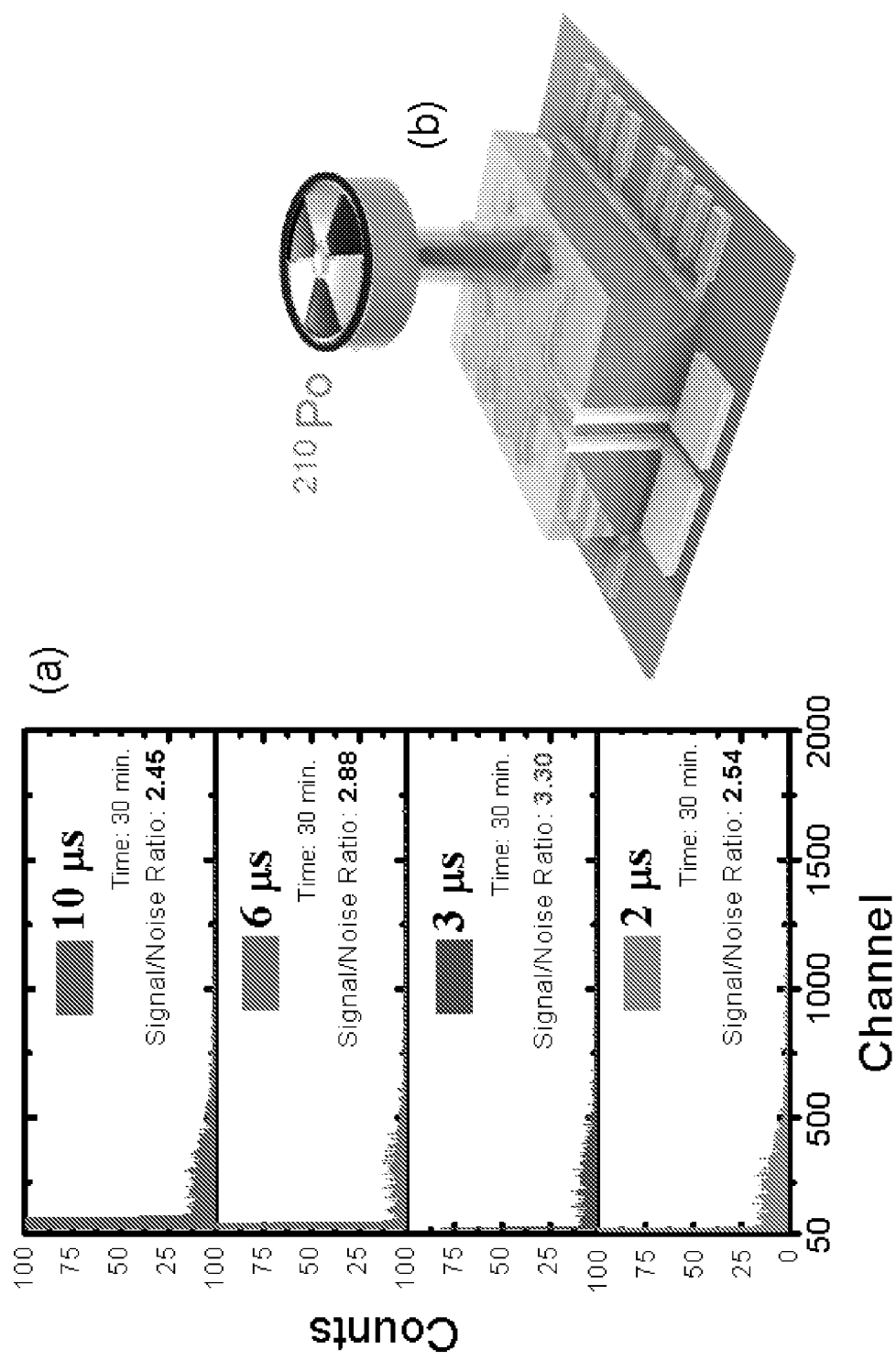
FIG. 12(a) shows plots of counts (in a.u.) versus channel, giving experimental data on detector response at different shaping times (10 microseconds (µs), 6 µs, 3 µs, and 2 µs) when exposed to a polonium-210 ($^{210}$Po) source, for the photodiode of FIG. 7(a), with the materials as referenced in FIG. 7(a). The signal-to-noise ratio (SNR) was the best at a shaping time of 3 µs (SNR =3.30).
FIG. 12(b) shows a schematic view of the device with the $^{210}$Po source, used to obtain the results in FIG. 12(a).

For high neutron capture efficiency, the neutron conversion layer (e.g., $^{10}$B conversion layer) must be thick enough to absorb the incoming thermal neutrons, but thin enough to allow the charged particles, $^4$He and $^7$Li, to reach the semiconductor material. The simulations run show that a 7 m thick CsPbBr$_3$ film can completely capture the incident alpha particles from the neutron reaction with $^{10}$B (see also FIGS. 11(a) and 11(b)). For the testing, the CsPbBr$_3$ diode was packaged and connected to an Ortec 109 pre-amplifier and an Ortec 572 shaping amplifier. Multi-channel analyzer data were collected using an Easy-MCA from Ortec. For the alpha test a $^{210}$Po source was placed at a distance of 1 millimeter (mm) from the diode. A typical setup optimization process is shown in FIG. 12(b), and the data is shown in FIG. 12(a). A shaping amplifier time constant of 3 μs yielded the best signal-to-noise ratio (SNR) and thus was selected for the testing. Similar optimizations were carried out for the other components.

Figures 4A, 4B, 4C:
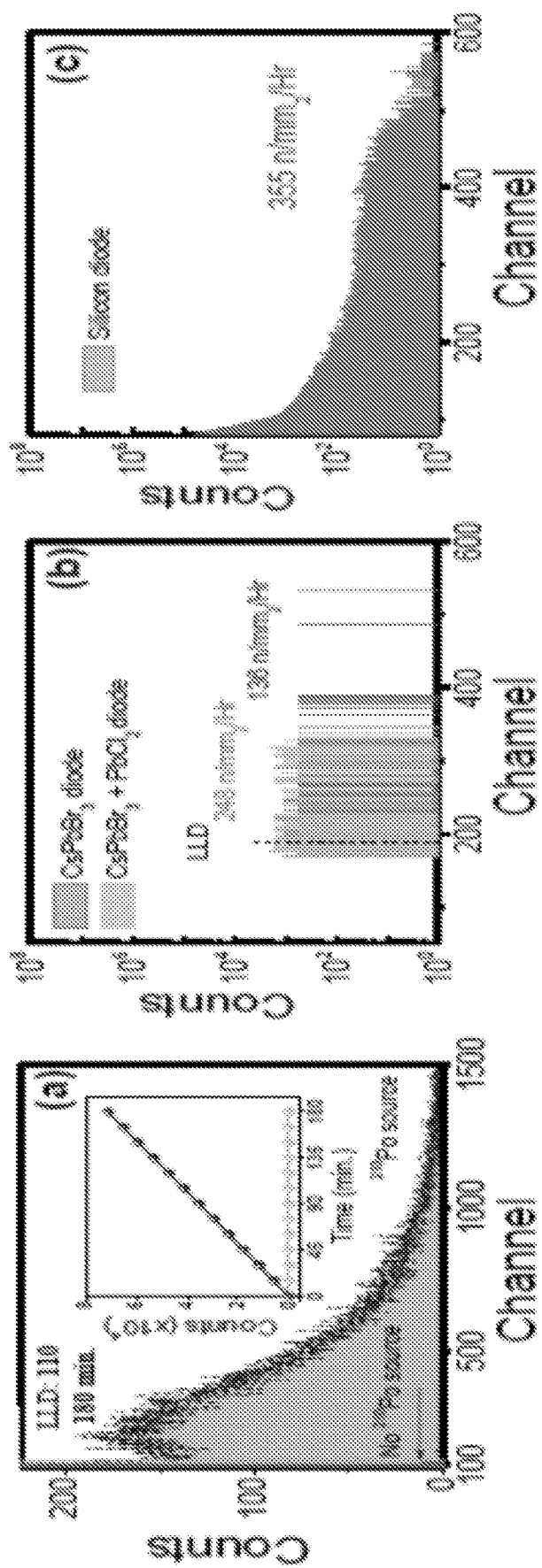
FIG. 4(a) shows a plot of counts versus channel for alpha particle response of the $Ga_2O_3/CsPbBr_3$ thin film diode shown in FIG. 2, when exposed to a source of polonium-210 ($^{210}Po$). Data was collected for 180 minutes with a shaping time constant of 3 microseconds (μs). The inset shows counts above lower limit of detection (LLD) for alpha particles (the (black) line that rises over time) and noise (the (green) line that stays flat over time), recorded every 15 minutes; the y-axis for the inset is counts ($\times 10^4$) and the x-axis for the inset is time (in minutes).
FIG. 4(b) shows a plot of counts versus channel for the $Ga_2O_3/CsPbBr_3$ thin film diode shown in FIG. 2 (the (green) lines that are mostly in the 180-350 channel area, with an LLD of 248 $n/mm^2/Hr$) and the $Ga_2O_3/CsPbBr_3$ thin film diode after a $PbCl_2$ treatment (the (blue) lines that are mostly in the 220-520 channel area, with an LLD of 136 $n/mm^2/Hr$). This shows the normalized neutron response of these diodes.
FIG. 4(c) shows a plot of counts versus channel for alpha particle response of a silicon diode. The LLD is 355 $n/mm^2/Hr$. The $Ga_2O_3/CsPbBr_3$ thin film diode after a $PbCl_2$ treatment had 71.4% of the efficiency of the silicon diode.

The results for alpha and neutron response are shown in FIGS. 4(a)-4(c). Referring to FIG. 4(a), the alpha peak is clearly observed after exposing the diodes to $^{210}$Po (5.3 MeV), demonstrating the Ga$_2$O$_3$/CsPbBr$_3$ diode sensitivity to alpha particles. The measured alpha response corresponds to 16% of that of a commercial OPF480 silicon (Si) diode when exposed to the same $^{210}$Po source, as shown in the comparison in FIG. 13. Referring to again to FIG. 4(a), the peak broadening can be due to various factors, such as the attenuation of alpha particles by the air and the top electrode, charge trapping in the semiconductor, and electronic noise (see also [50]).

Figures 15A, 15B, 15C:
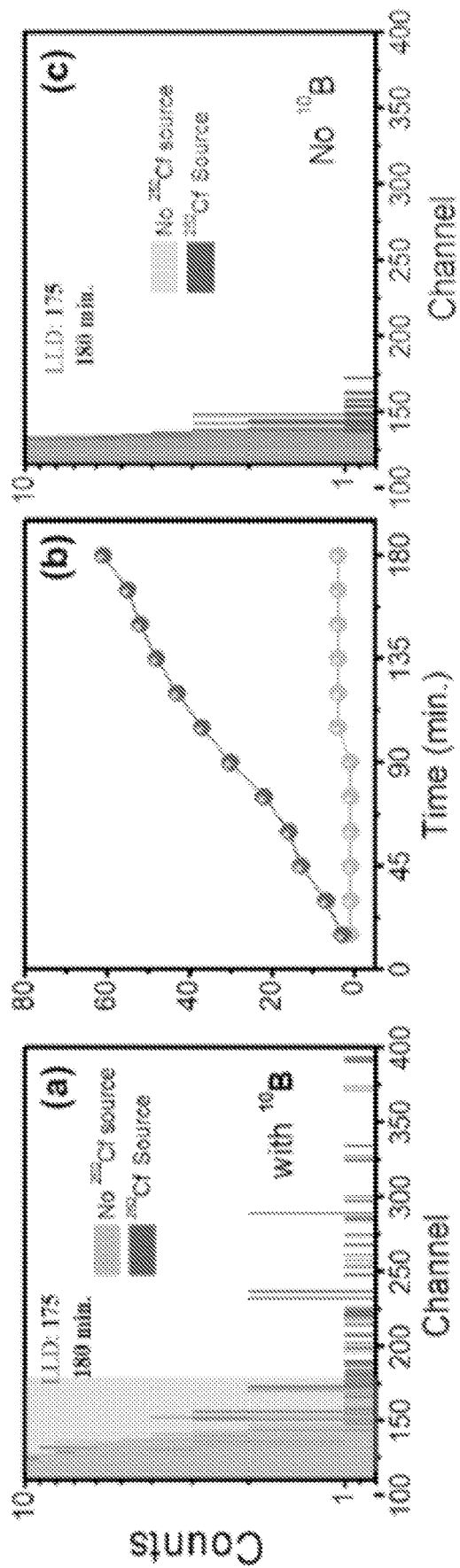
FIG. 15(a) shows a plot of counts versus channel for neutron response of the solid-state neutron detector of FIG. 14 (using 10B as the neutron conversion layer and a Ga$_2$O$_3$/CsPbBr$_3$ diode as the solid state detector), when exposed to a source of californium-252 ($^{252}$Cf). Data was collected for 180 minutes. The (green) lines that are prominent in the 100-175 channel area are for no $^{252}$Cf source (noise); and the (blue) lines that are prominent above channel 175 are for when there was a $^{252}$Cf source. The lower limit of detection (LLD) was 175.
FIG. 15(b) shows a plot of counts versus time (in min) for neutron response of the solid-state neutron detector of FIG. 14 (using $^{10}$B as the neutron conversion layer and a Ga$_2$O$_3$/CsPbBr$_3$ diode as the solid state detector), when exposed to the source of $^{252}$Cf. Data was collected for 180 minutes, with neutron and noise counts recorded every 15 minutes. The (blue) curve that has a higher value at time =180 min is for neutron counts; and the (green) curve that has a lower value at time =180 min is for noise counts.
FIG. 15(c) shows a plot of counts versus channel for neutron response of the solid-state neutron detector of FIG. 14 (using Ga$_2$O$_3$/CsPbBr$_3$ diode as the solid state detector) without the neutron conversion layer ($^{10}$B). Data was collected for 180 minutes. The (green) lines that are prominent in the 100-130 channel area are for no $^{252}$Cf source (noise); and the (blue) lines that are prominent above channel 130 are for when there was a $^{252}$Cf source. The lower limit of detection (LLD) was 175.

Next, the diode was exposed to thermal neutrons using a $^{252}$Cf source, using a setup as shown in FIG. 14. The response of the diode is shown in FIG. 15(a). Results show neutron counts one order of magnitude higher than the background noise; background noise measurements were performed before the exposure to the $^{252}$Cf source. No increase in the background counts was observed for alpha particle or neutron exposure, indicating that the increase in the counts with time are a result of energetic particles absorbed in the Ga$_2$O$_3$/CsPbBr$_3$ diode, as seen in the inset of FIG. 4(a) and in FIG. 15(b).

In order to demonstrate the stability of the diode exposed to thermal neutrons, diodes without the $^{10}$B conversion layer were exposed to the $^{252}$Cf source. No counts were detected above the lower level of detection (LLD), as seen in FIG. 15(c). This confirms that the counts originated from the alphas generated in the $^{10}$B layer after neutron interaction and absorbed in the diode and not due to gammas from the $^{252}$Cf source. FIG. 4(b) shows a normalized comparison of neutron response between the CsPbBr$_3$ and CsPbBr$_3$+PbCl$_2$ diodes when exposed to the $^{252}$Cf source. Theoretical efficiency using a $^{10}$B conversion layer is about 4.5%, and the calculated efficiency showed about 1% for CsPbBr$_3$ and a substantial increase to 2.5% for CsPbBr$_3$+PbCl$_2$ detectors that represents 71.4% of the obtained silicon efficiency (see FIG. 4(c)). No known prior art system or method performs neutron detection using a thin film CsPbBr$_3$ based device.

EXAMPLE 3

Carrier concentration profiling with C-V data was performed on a Ga$_2$O$_3$/CsPbBr$_3$ diode. With an abrupt junction approximation, carrier concentration in the perovskite film (N$_A$) as a function of depletion width can be plotted by analyzing the C-V data using the following two equations:

$$C = \epsilon_0 \epsilon_r \frac{A}{W} \quad (2)$$

$$N_A = \frac{2}{q\epsilon_0\epsilon_r \left[d(A^2/C^2)/dV\right]} \quad (3)$$

where W is the depletion width, C is the measured capacitance, A is the device area, q is the elementary charge and $\epsilon_r$ and $\epsilon_0$ are the permittivity of the semiconductor and free space, respectively. The estimated values of carrier concentration versus depletion width are given in FIG. 8, which shows a depletion width of about 8 µm. The thicknesses of the films used for the devices in were in the range of 8 µm, so the depletion width coincides with the film thickness.

The carrier concentration (NA) profile resembles the characteristic U-shape seen in many semiconductor devices, indicating a quasi-uniform carrier concentration in the depletion region (see also [9],[10]). It is evident that the carrier concentration is high near the Ga$_2$O$_3$/CsPbBr$_3$ interface (indicated in FIG. 8), which decreases towards the bulk of the film. The observed apparent increase in the carrier concentration near the front interface (Ga$_2$O$_3$/CsPbBr$_3$ junction) may be due to high concentration of defect (or impurity) levels. However, the carrier concentration of the CsPbBr$_3$ bulk was maintained at about 3 ×10$^9$ cm$^{-3}$, which coincides with the value obtained from Hall Effect measurement. The slight increase seen at the back side could be related to the Au contact.

EXAMPLE 4

Prior to depositing the Au contact, selected Ga$_2$O$_3$/CsPbBr$_3$ devices were submitted to a thermal treatment in an ambient of PbCl$_2$ vapor. During this thermal processing, the CsPbBr$_3$ composition was modified through anion-exchange, transforming to a mixed halide (CsPbBr$_{3-x}$Cl$_x$), which maintained the orthorhombic structure. The film morphology revealed larger grains (see FIG. 10(b)), and the diode leakage current lowered by more than half order (see FIG. 10(c)). The photoresponse of the diode increased, which lead to a 11% increase in on/off ratio (see FIG. 10(d)).

EXAMPLE 5

Figure 13:
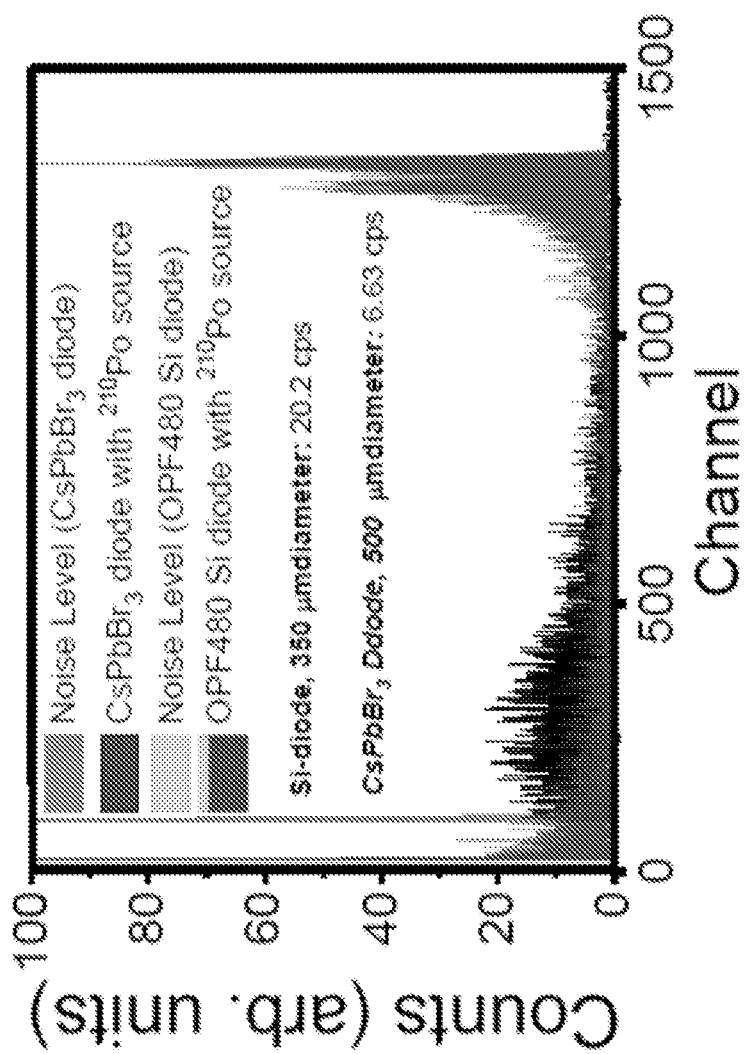
FIG. 13 shows a plot of counts (in a.u.) versus channel, giving alpha counts recorded by the Ga$_2$O$_3$/CsPbBr$_3$ detector (see FIGS. 7(a) and 12(b)) and a commercial OPF480 silicon (Si) diode, both exposed to the $^{210}$Po source. The (red) lines that are mostly in the 100 channel area are for noise level of the Ga$_2$O$_3$/CsPbBr$_3$ detector/diode; the (black) lines that are higher in the 100-600 channel area are for the Ga$_2$O$_3$/CsPbBr$_3$ detector/diode with the $^{210}$Po source; the (green) lines that are mostly in the 0-10 channel area are for noise level of the OPF480 Si diode; and the (blue) lines that are very high in the 1000-1300 channel area are for the OPF480 Si diode with the $^{210}$Po source.

In order to compare qualitatively the alpha response of the thin-film CsPbBr$_3$ detector, an off-the-shelf OPF480 Si diode with aperture diameter 350 µm was used for comparison. It was assumed that the Si diode had 100% alpha detection efficiency. The alpha count rate upon exposure to the $^{210}$Po source was measured under identical conditions as that used for the CsPbBr$_3$ detector. The estimated alpha detection efficiency of the CsPbBr$_3$ detector was 16% of that of the Si detector. The histograms of both measurements are shown in FIG. 13.

EXAMPLE 6

Figures 16A, 16B, 16C, 16D, 16E, 16F:
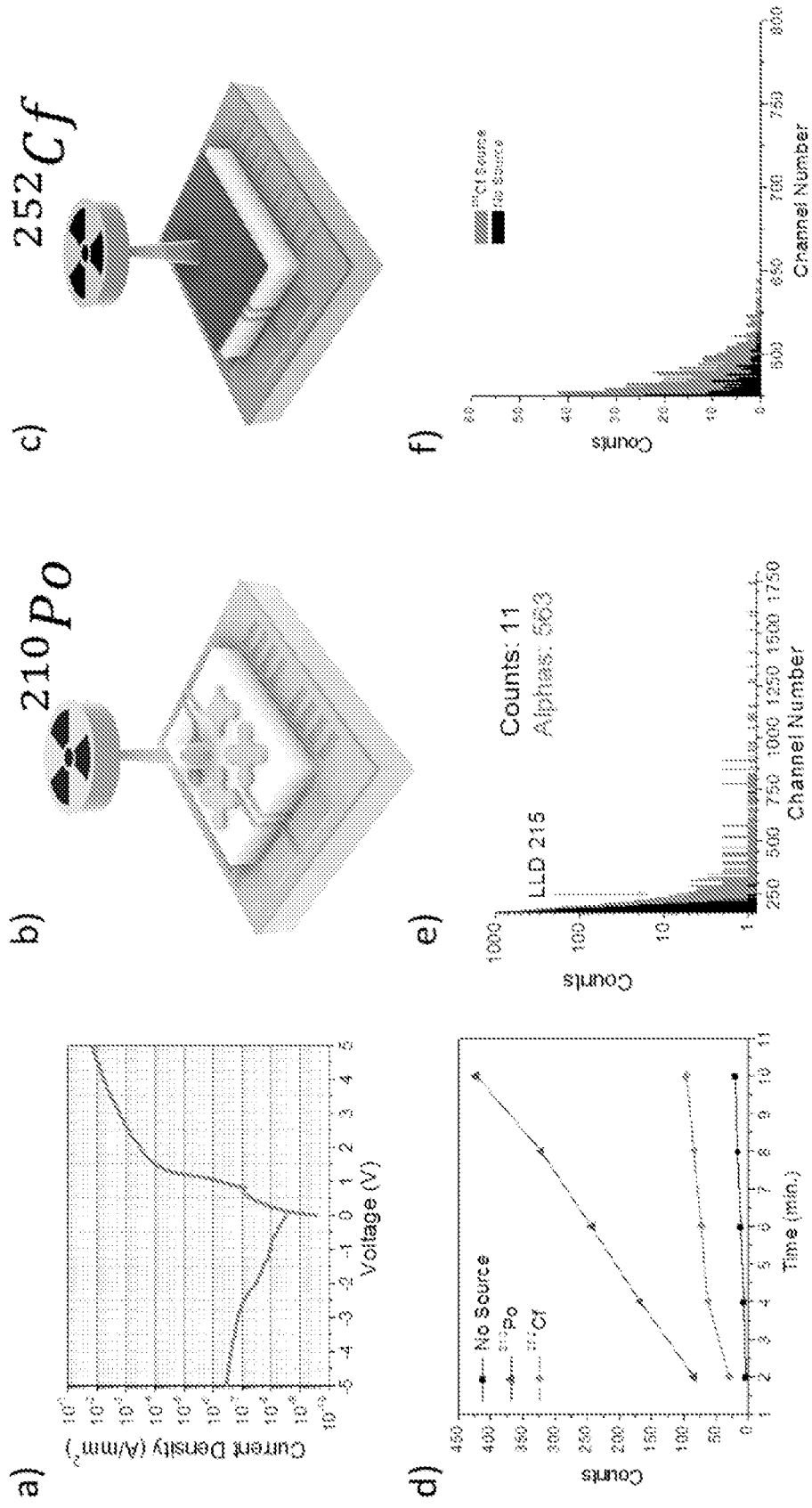
FIG. 16(a) shows a plot of current density (in A/mm$^2$) versus voltage (in V), providing the J-V characteristic curve of a photodiode detector with a methylammonium (MA) lead chloride (MAPbCl$_3$) thin film (prepared by a two-step deposition method) and a Ga$_2$O$_3$ semiconductor.
FIG. 16(b) shows a schematic view of the Ga$_2$O$_3$/MAPbCl$_3$ detector under alpha radiation from a $^{210}$Po source.
FIG. 16(c) shows a schematic view of the Ga$_2$O$_3$/MAPbCl$_3$ detector under neutron radiation from a $^{252}$Cf source, the detector including a neutron conversion layer thereon.
FIG. 16(d) shows a plot of counts versus time (in minutes) for the Ga$_2$O$_3$/MAPbCl$_3$ detector for a neutron source (the (red) curve in the middle), an a source (the (blue) curve that has the highest count values), and no source (the (black) curve with the lowest count values).
FIG. 16(e) shows a plot of counts versus channel number, showing spectra of the Ga$_2$O$_3$/MAPbCl$_3$ detector under α radiation. The LLD was 215.
FIG. 16(f) shows a plot of counts versus channel number, showing spectra of the Ga$_2$O$_3$/MAPbCl$_3$ detector under neutron radiation. The (black) lines that are much lower are for no source present, and the (red) lines that are much higher are for when the $^{252}$Cf source was present.

A photodiode detector similar to that shown in FIG. 7(a), but with a MAPbCl$_3$ film as the active layer (and Ga$_2$O$_3$ semiconductor), was fabricated and tested. FIG. 16(a) shows the J-V characteristic curve. FIG. 16(b) shows a schematic view of the Ga$_2$O$_3$/MAPbCl$_3$ detector under alpha radiation from a $^{210}$Po source. FIG. 16(c) shows a schematic view of the Ga$_2$O$_3$/MAPbCl$_3$ detector under neutron radiation from a $^{252}$Cf source, the detector including a neutron conversion layer (e.g., $^{10}$B) thereon. FIG. 16(d) shows a plot of counts versus time for the Ga$_2$O$_3$/MAPbCl$_3$ detector for a neutron source, an a source, and no source. FIG. 16(e) shows spectra of the Ga$_2$O$_3$/MAPbCl$_3$ detector under a radiation. FIG. 16(f) shows spectra of the Ga$_2$O$_3$/MAPbCl$_3$ detector under neutron radiation.

EXAMPLE 7

Figures 17A, 17B, 17C, 17D, 17E, 17F:
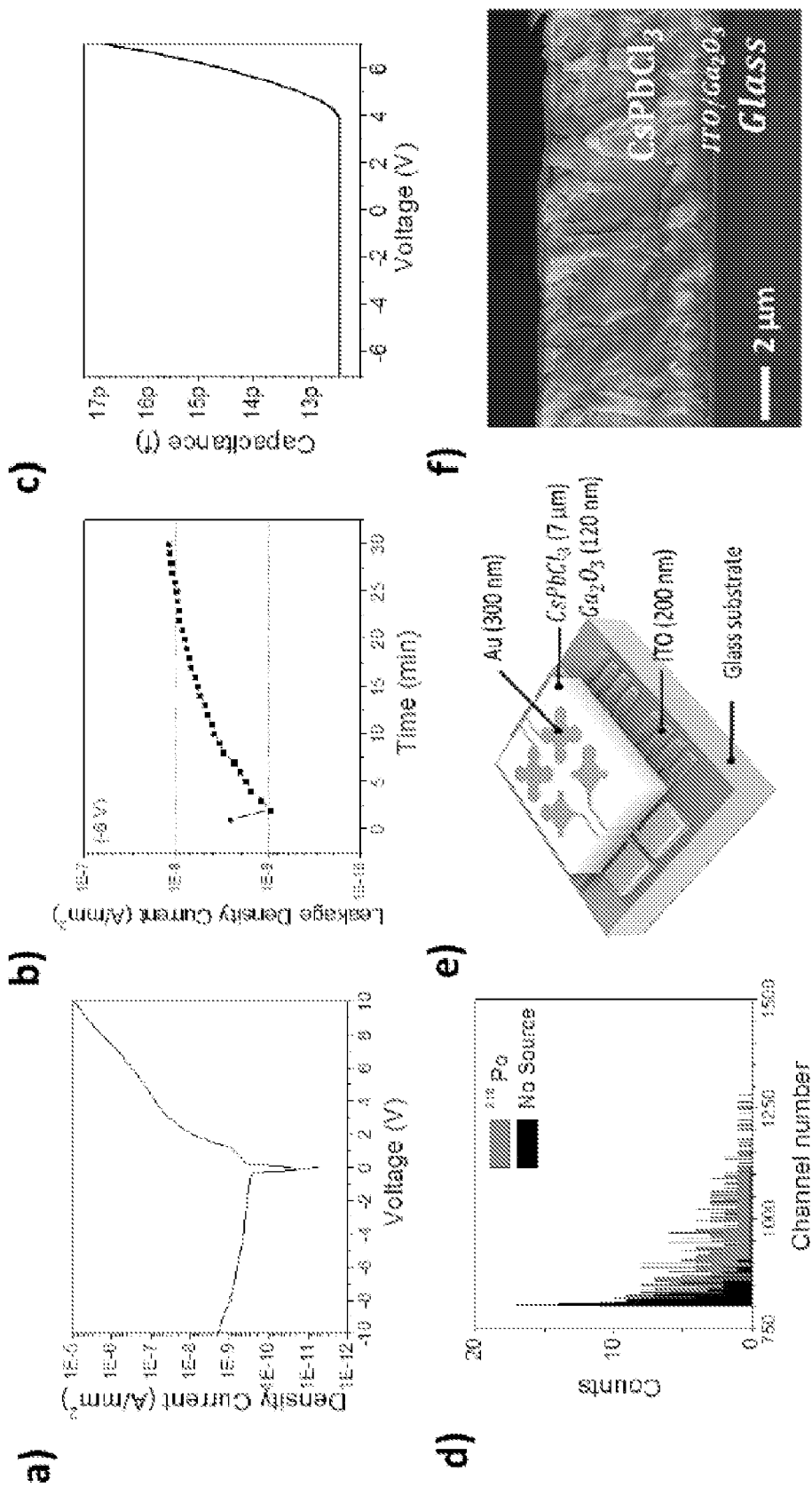
FIG. 17(a) shows a plot of current density (in A/mm$^2$) versus voltage (in V), providing the J-V characteristic curve of a photodiode detector with a CsPbCl$_3$ thin film and a Ga$_2$O$_3$ semiconductor.
FIG. 17(b) shows a plot of leakage density current (in A/mm$^2$) versus time (in minutes) for the Ga$_2$O$_3$/CsPbCl$_3$ diode under a stress test.
FIG. 17(c) shows a plot of capacitance (in Farads (F)) versus voltage (in V), providing the C-V characteristic curve of the Ga$_2$O$_3$/CsPbCl$_3$ diode.
FIG. 17(d) shows a plot of counts versus channel number, providing the spectra of the Ga$_2$O$_3$/CsPbCl$_3$ diode under alpha radiation. The (black) lines that are most prevalent in a range of channels 800-850 are for no source present, and the (red) lines that are most prevalent for channel 850 and higher are for when the $^{210}$Po source was present.
FIG. 17(e) shows a schematic view of the Ga$_2$O$_3$/CsPbCl$_3$ diode, according to an embodiment of the subject invention. Though the figure refers to the contacts as Au and ITO and the substrate as glass and provides thickness values, these are for exemplary purposes only.
FIG. 17(f) shows a cross-sectional SEM image of the Ga$_2$O$_3$/CsPbCl$_3$ heterojunction. The scale bar is 2 μm.

A photodiode detector with a CsPbCl$_3$ film as the active layer (and Ga$_2$O$_3$ semiconductor) was fabricated and tested. FIG. 17(e) shows a schematic view of the Ga$_2$O$_3$/CsPbCl$_3$ diode. FIG. 17(a) shows the J-V characteristic curve of the photodiode detector. FIG. 17(b) shows a plot of leakage density current versus time for the Ga$_2$O$_3$/CsPbCl$_3$ diode under a stress test. FIG. 17(c) shows the C-V characteristic curve of the Ga$_2$O$_3$/CsPbCl$_3$ diode. FIG. 17(d) shows the spectra of the Ga$_2$O$_3$/CsPbCl$_3$ diode under alpha radiation. FIG. 17(f) shows a cross-sectional SEM image of the Ga$_2$O$_3$/CsPbCl$_3$ heterojunction.

EXAMPLE 8

Figures 18A, 18B, 18C, 18D, 18E:
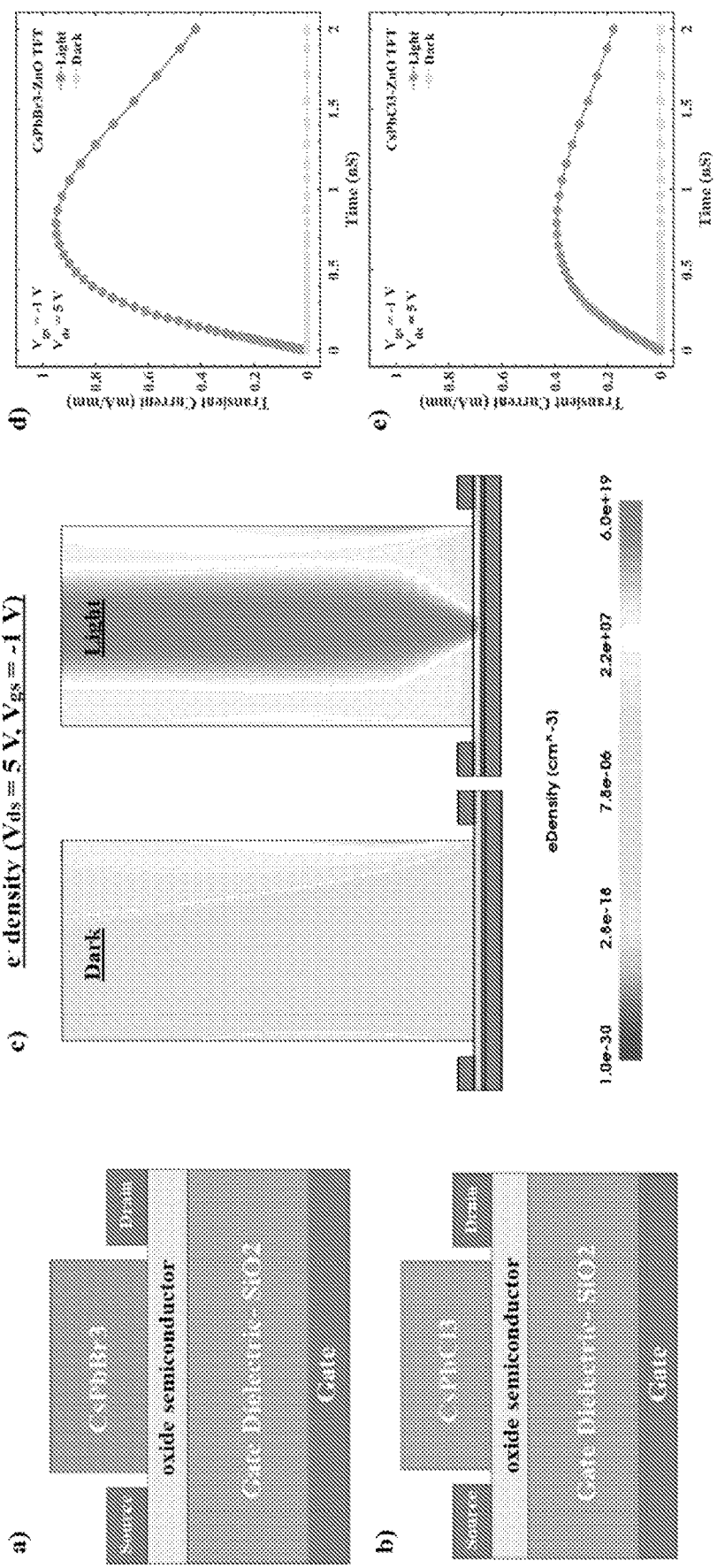
FIG. 18(a) shows a schematic view of an alpha and neutron sensitive thin film transistor with bottom gate thin film transistor architecture and a CsPbBr$_3$ film acting as the alpha sensitive layer, according to an embodiment of the subject invention. A neutron conversion material or layer can be disposed on the film.
FIG. 18(b) shows a schematic view of an alpha and neutron sensitive thin film transistor with bottom gate thin film transistor architecture and a CsPbCl$_3$ film acting as the alpha sensitive layer, according to an embodiment of the subject invention. A neutron conversion material or layer can be disposed on the film.
FIG. 18(c) shows simulation results of electron density in the perovskite film from the transistor of FIGS. 18(a) and 18(b), under alpha particle exposure (light).
FIG. 18(d) shows a plot of transient current (in milliamps per millimeter (mA/mm)) versus time (in nanoseconds (ns)) for the transistor of FIG. 18(a) with the CsPbBr$_3$ film, under alpha irradiation. The (purple) curve with the higher values is for when light was provided, and the (green) curve with the lower values is for when it was dark. The structure showed promising results for alpha/neutron detection and signal amplification.
FIG. 18(e) shows a plot of transient current (in mA/mm) versus time (in ns) for the transistor of FIG. 18(b) with the CsPbCl$_3$ film, under alpha irradiation. The (orange) curve with the higher values is for when light was provided, and the (green) curve with the lower values is for when it was dark. The structure showed promising results for alpha/neutron detection and signal amplification.

An alpha and neutron sensitive thin film transistor (TFT) was tested, using a CsPbBr$_3$ film (FIG. 18(a)) or a CsPbCl$_3$ film (FIG. 18(b)) as the alpha sensitive layer. A neutron conversion layer was disposed on the film. FIGS. 18(a) and 18(b) show schematic views of the TFTs. FIG. 18(c) shows simulation results (Synopsys-TCAD simulations) of electron density in the perovskite film from the TFT under alpha particle exposure (light). FIG. 18(d) shows a plot of transient current for the TFT with the $CsPbBr_3$ film, under alpha irradiation. FIG. 18(e) shows a plot of transient current for the TFT with the $CsPbCl_3$ film, under alpha irradiation. Referring to FIGS. 18(c), 18(d), and 18(e), the alpha and neutron sensitive TFT showed promising results for alpha/neutron detection and signal amplification.

It should be understood that the examples and embodiments described herein are for illustrative purposes only and that various modifications or changes in light thereof will be suggested to persons skilled in the art and are to be included within the spirit and purview of this application.

All patents, patent applications, provisional applications, and publications referred to or cited herein (including those in the "References" section) are incorporated by reference in their entirety, including all figures and tables, to the extent they are not inconsistent with the explicit teachings of this specification.

What is claimed is:

1. A radiation detector, comprising:
    a substrate;
    a perovskite film disposed on the substrate and capable of detecting alpha particles; and
    a first contact disposed on the perovskite film and a second contact disposed on the substrate,
    wherein the perovskite film has a thickness in a range of from 100 nanometers (nm) to 50 micrometers (μm),
    wherein the first contact comprises a plurality of first contacts,
    wherein the second contact comprises a plurality of second contacts, and
    wherein the radiation detector further comprises an anode electrically connected to one of the first contacts and a cathode electrically connected to another of the first contacts.

2. The radiation detector according to claim 1, further comprising a neutron conversion material disposed on the perovskite film.

3. The radiation detector according to claim 2, wherein the neutron conversion material is boron-10 ($^{10}B$).

4. A method of detecting neutrons, the method comprising:
    providing the radiation detector according to claim 2; and
    using the radiation detector to detect neutrons.

5. The radiation detector according to claim 1, wherein the perovskite film has the formula $A^1A^2X_3$, where $A^1=CH_3NH_3$, $CH_2(NH_2)_2$, or cesium (Cs); $A^2$=lead (Pb) or tin (Sn); and X=chlorine (Cl), bromine (Br), or iodine (I)).

6. The radiation detector according to claim 1, wherein the perovskite film is cesium lead bromide ($CsPbBr_3$), methylammonium (MA) lead bromide ($MAPbBr_3$), MA lead chloride ($MAPbCl_3$), or $CsPbCl_3$.

7. The radiation detector according to claim 1, wherein the perovskite film is $CsPbBr_3$.

8. The radiation detector according to claim 1, wherein the thickness of the perovskite film is in a range of from 100 nm to 10 μm.

9. The radiation detector according to claim 1, further comprising a semiconductor material on which the perovskite film is disposed.

10. The radiation detector according to claim 9, wherein the semiconductor material is $Ga_2O_3$.

11. The radiation detector according to claim 9, wherein the perovskite film is in direct physical contact with the semiconductor material.

12. The radiation detector according to claim 9, further comprising a conductive material between the substrate and the semiconductor material.

13. The radiation detector according to claim 1, wherein the first contact comprises gold (Au), and
    wherein the second contact comprises indium tin oxide (ITO).

14. The radiation detector according to claim 1, wherein the perovskite film is deposited using a close space sublimation (CSS) process.

15. The radiation detector according to claim 1, further comprising a gate disposed on the substrate, a gate dielectric disposed on the gate, an oxide semiconductor disposed on the gate dielectric, and a source and a drain disposed on the oxide semiconductor,
    wherein the perovskite film is disposed on the oxide semiconductor, and
    wherein the radiation detector is a phototransistor.

16. A method of detecting alpha particles, the method comprising:
    providing the radiation detector according to claim 1; and
    using the radiation detector to detect alpha particles.

17. A radiation detector, comprising:
    a substrate; and
    a perovskite film disposed on the substrate and capable of detecting alpha particles,
    wherein the perovskite film has a thickness in a range of from 100 nanometers (nm) to 50 micrometers (μm), and
    wherein a grain size of the perovskite film is the same as the thickness of the perovskite film.

* * * * *